United States Patent
Dong

(10) Patent No.: US 12,543,401 B2
(45) Date of Patent: Feb. 3, 2026

(54) PHOTODETECTOR

(71) Applicant: HAMAMATSU PHOTONICS K.K., Hamamatsu (JP)

(72) Inventor: Wei Dong, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 849 days.

(21) Appl. No.: 17/883,819

(22) Filed: Aug. 9, 2022

(65) Prior Publication Data
US 2023/0058136 A1 Feb. 23, 2023

(30) Foreign Application Priority Data

Aug. 20, 2021 (JP) ................................. 2021-134738

(51) Int. Cl.
*H10F 77/40* (2025.01)
*H10F 30/223* (2025.01)

(52) U.S. Cl.
CPC ......... *H10F 77/413* (2025.01); *H10F 30/223* (2025.01)

(58) Field of Classification Search
CPC ............................. H10F 77/413; H10F 30/223
See application file for complete search history.

(56) References Cited

U.S. PATENT DOCUMENTS

| 2009/0134486 A1 | 5/2009 | Fujikata |
| 2010/0270638 A1 | 10/2010 | Ahn |
| 2016/0322592 A1 | 11/2016 | Park et al. |
| 2019/0319139 A1* | 10/2019 | Cho ....................... H10F 77/413 |
| 2020/0220036 A1* | 7/2020 | Azize ................... H10F 71/1274 |

(Continued)

FOREIGN PATENT DOCUMENTS

| CN | 109755331 A | 5/2019 |
| JP | H11-135522 A | 5/1999 |

(Continued)

OTHER PUBLICATIONS

Sundararajan, Sri Priya et al., "Nanoparticle-Induced Enhancement and Suppression of Photocurrent in a Silicon Photodiode", Nano Letters, 2008, vol. 8, No. 2, pp. 624-p630.

(Continued)

*Primary Examiner* — Mounir S Amer
(74) *Attorney, Agent, or Firm* — Faegre Drinker Biddle & Reath LLP

(57) ABSTRACT

A photodetector includes: a first conductive type semiconductor layer; a semiconductor light absorption layer provided on the first conductive type semiconductor layer; a scatterer that is provided with a width equal to or less than a wavelength of incident light so as to be in contact with the semiconductor light absorption layer and forms a localized non-uniform electric field inside the semiconductor light absorption layer by scattering the incident light; a second conductive type semiconductor layer provided on the semiconductor light absorption layer so as to be apart from the scatterer; and an extraction electrode that is provided on the second conductive type semiconductor layer so as to be apart from the scatterer and extracts a photocurrent generated in the semiconductor light absorption layer due to formation of the localized non-uniform electric field.

10 Claims, 21 Drawing Sheets

(56) References Cited

U.S. PATENT DOCUMENTS

| | | | |
|---|---|---|---|
| 2021/0126027 A1* | 4/2021 | Na | H10F 77/933 |
| 2023/0055105 A1* | 2/2023 | Takemura | H10F 77/14 |
| 2023/0085007 A1* | 3/2023 | Simoyama | H10F 77/122 |
| | | | 257/432 |

FOREIGN PATENT DOCUMENTS

| | | |
|---|---|---|
| JP | 2005166870 A | 6/2005 |
| JP | 2007273832 A | 10/2007 |
| JP | 2010021189 A | 1/2010 |
| JP | 2019016628 A | 1/2019 |
| WO | WO-2009/088071 A1 | 7/2009 |
| WO | 2014/174866 A1 | 10/2014 |

OTHER PUBLICATIONS

Islam, Kazi et al., "Effect of gold nanoparticles size on light scattering for thin film amorphous-silicon solar cells", Solar Energy, 2014, vol. 103, pp. 263-p268.

* cited by examiner

PHOTODETECTOR

TECHNICAL FIELD

The present disclosure relates to a photodetector.

BACKGROUND

In recent years, the development of laser sensing technology used for the automatic driving function or the collision prevention function of vehicles has been remarkable, and the development of an inexpensive and high-performance photodetector in the infrared region has been demanded. For example, in the shortwave infrared (SWIR) band with a wavelength of 1.3 µm or more, semiconductor light receiving elements using InGaAs as a substrate are the mainstream. However, high-performance array type photodetectors using the substrate have a problem in terms of cost.

With this background, as a photodetector that does not depend on InGaAs, a photodetector that uses a localized non-uniform electric field inside the semiconductor light absorption layer has been developed. In this type of photodetector, a semiconductor material having an indirect transition is generally used, and a localized non-uniform electric field is generated inside the semiconductor light absorption layer according to the incidence of light. One of the effects of the localized non-uniform electric field is that a large wave number can be given to the electrons inside the semiconductor by the uncertainty principle. Therefore, even a semiconductor material having an indirect transition can directly perform an optical transition, so that sufficient light absorption can be ensured.

Examples of such a photodetector include a light receiving element described in International Publication WO 2009/088071. In this known light receiving element, a first conductive type semiconductor layer, a non-doped semiconductor light absorption layer, a second conductive type semiconductor layer, and a conductive layer are provided on a substrate in this order. The laminate of the conductive layer, the second conductive type semiconductor layer, and the non-doped semiconductor light absorption layer has a plurality of periodically arranged openings. The opening has a width equal to or less than the wavelength of incident light, and is provided so as to penetrate the conductive layer and the second conductive type semiconductor layer and reach the non-doped semiconductor light absorption layer.

For example, a light receiving element described in U.S. Unexamined Patent Publication No. 2009/0134486 includes a semiconductor layer and a pair of metal electrodes arranged on the surface of the semiconductor layer at predetermined distances d to form an MSM junction. The distance between the pair of metal electrodes satisfies the relationship of $\lambda > d$ assuming that the wavelength of the incident light is $\lambda$. At least one of the pair of metal electrodes forms a Schottky junction with the semiconductor layer, and is embedded in the semiconductor layer up to a position having a depth smaller than $\lambda/(2n)$ assuming that the refractive index of the semiconductor layer is n.

In order to improve the detection sensitivity of the photodetector described above, it is necessary to sufficiently secure the wave number component of the localized non-uniform electric field in the semiconductor light absorption layer. The effect of the localized non-uniform electric field is rapidly attenuated by increasing the distance between a position where the localized non-uniform electric field is generated and the position of a depletion layer in the semiconductor light absorption layer. In the light receiving element described in International Publication WO 2009/088071, the position where the localized non-uniform electric field is generated is in the vicinity of the interface between the conductive layer and the second conductive type semiconductor layer, but the position where the localized non-uniform electric field is generated is apart from the non-doped semiconductor light absorption layer by the thickness of the second conductive type semiconductor layer. For this reason, from the viewpoint of improving the detection sensitivity, there is room for further improvement.

In the light receiving element described in U.S. Unexamined Patent Publication No. 2009/0134486, the detection sensitivity is improved by embedding the metal electrode in the semiconductor layer. However, since the semiconductor layer at the position where the localized non-uniform electric field is generated is integrated with a photocurrent extraction electrode, there is a problem that a dark current due to the Schottky junction is relatively large. For this reason, the light receiving element described in U.S. Unexamined Patent Publication No. 2009/0134486 has a problem that it is difficult to improve the SN ratio.

SUMMARY

The invention has been made to solve the aforementioned problems, and it is an object of the invention to provide a photodetector capable of improving detection sensitivity while suppressing a dark current.

A photodetector according to an aspect of the invention includes: a first conductive type semiconductor layer; a semiconductor light absorption layer provided on the first conductive type semiconductor layer; a scatterer that is provided with a width equal to or less than a wavelength of incident light so as to be in contact with the semiconductor light absorption layer and forms a localized non-uniform electric field inside the semiconductor light absorption layer by scattering the incident light; a second conductive type semiconductor layer provided on the semiconductor light absorption layer so as to be apart from the scatterer; and an extraction electrode that is provided on the second conductive type semiconductor layer so as to be apart from the scatterer and extracts a photocurrent generated in the semiconductor light absorption layer due to formation of the localized non-uniform electric field.

In the photodetector, a scatterer that forms a localized non-uniform electric field inside the semiconductor light absorption layer by scattering the incident light is provided with a width equal to or less than the wavelength of the incident light so as to be in contact with the semiconductor light absorption layer. Therefore, since the position where the localized non-uniform electric field is generated and the position of a depletion layer in the semiconductor light absorption layer can be matched or brought close to each other, the effect of the localized non-uniform electric field in the semiconductor light absorption layer can be sufficiently obtained. As a result, it is possible to improve the detection sensitivity. In addition, in the photodetector, an extraction electrode for extracting the photocurrent generated in the semiconductor light absorption layer due to the formation of the localized non-uniform electric field is provided apart from the scatterer. With such a configuration, the generation of dark current due to the Schottky junction can be suppressed as compared with a case where the semiconductor light absorption layer and the extraction electrode are in contact with each other or a case where the scatterer itself serves as an extraction electrode.

The scatterer may be a metal nanostructure that causes surface plasmon resonance in a vicinity of an interface between the scatterer and the semiconductor light absorption layer. In this case, the scatterer can be formed at a desired position with high reproducibility by nano-patterning. Therefore, it is possible to increase the manufacturing yield of the photodetector.

A recess that penetrates the second conductive type semiconductor layer and cuts out a part of the semiconductor light absorption layer may be provided in the second conductive type semiconductor layer, and the scatterer may be arranged on a bottom surface of the recess. According to this configuration, the scatterer and the junction interface between the first conductive type semiconductor layer and the semiconductor light absorption layer can be brought close to each other according to the depth of the recess. Therefore, since the path of the photocurrent generated in the semiconductor light absorption layer is shortened, it is possible to realize a high-speed response for photodetection.

A recess that penetrates the second conductive type semiconductor layer and cuts out a part of the semiconductor light absorption layer may be provided in the second conductive type semiconductor layer, and the scatterer may be arranged on a bottom surface and an inner wall surface of the recess. In this case, since lift-off using a resist for nano-patterning is not required for forming the scatterer, the ease of manufacturing the photodetector can be improved.

The semiconductor light absorption layer may be configured to include a first layer whose conductive type is p-type, a second layer whose conductive type is i-type, and a third layer whose conductive type is n-type, the recess may be provided at a depth for cutting out a part of the second layer, and the scatterer may be arranged on the bottom surface of the recess so as to be embedded in the second layer. According to this configuration, since the scatterer is embedded in the second layer whose conductive type is i-type and in which the depletion layer is located, the path of the photocurrent generated in the semiconductor light absorption layer is shortened. Therefore, it is possible to realize a high-speed response for photodetection. In addition, since the position of the depletion layer can be matched to the region where the electric field changes abruptly due to the localized non-uniform electric field, it is possible to efficiently perform photoelectric conversion of the incident light.

A width of the recess may be equal to or less than the wavelength of the incident light over an entire depth direction. In this case, since it becomes easy to match the position of the depletion layer to the region where the electric field changes abruptly due to the localized non-uniform electric field, it is possible to further increase the efficiency of photoelectric conversion of the incident light.

A width of a portion of the recess that penetrates the second conductive type semiconductor layer may be larger than a width of a portion of the recess that cuts out a part of the semiconductor light absorption layer. In this case, the loss of incident light due to the second conductive type semiconductor layer can be reduced. This configuration is suitable for a configuration in which light is incident from the second conductive type semiconductor layer side.

An insulating layer formed of a material having a refractive index smaller than that of the semiconductor light absorption layer may be provided in the recess. In this case, it is possible to protect the scatterer or prevent leakage from the scatterer by using the insulating layer. In addition, since the refractive index of the insulating layer is smaller than the refractive index of the semiconductor light absorption layer, the localized non-uniform electric field can be concentrated on the semiconductor light absorption layer having a relatively high refractive index. Therefore, it is possible to further improve the detection sensitivity.

A plurality of the scatterers may be provided at predetermined distances in an in-plane direction of an interface between the scatterer and the semiconductor light absorption layer. In this case, since the light receiving region (area of the scatterer) of the incident light is expanded, it is possible to improve the detection sensitivity.

The photodetector may be a back surface incidence type photodetector in which the incident light is incident from the first conductive type semiconductor layer side, and a reflective film for reflecting a component transmitted through the scatterer, of the incident light incident on a back surface, to the semiconductor light absorption layer side may be provided on the second conductive type semiconductor layer. In this case, since a component transmitted through the scatterer is reflected by the reflective film and directed toward the semiconductor light absorption layer again, it is possible to improve the amount of light absorption in the semiconductor light absorption layer.

DETAILED DESCRIPTION

Hereinafter, preferred embodiments of a photodetector according to an aspect of the invention will be described in detail with reference to the diagrams.

In each embodiment and diagrams of the photodetector shown below, one constituent unit of the incident region of incident light to be detected is shown as a main part. In the actual photodetector, these constituent units are arrayed at predetermined pitches therebetween.

First Embodiment of Photodetector

Figure 1A:
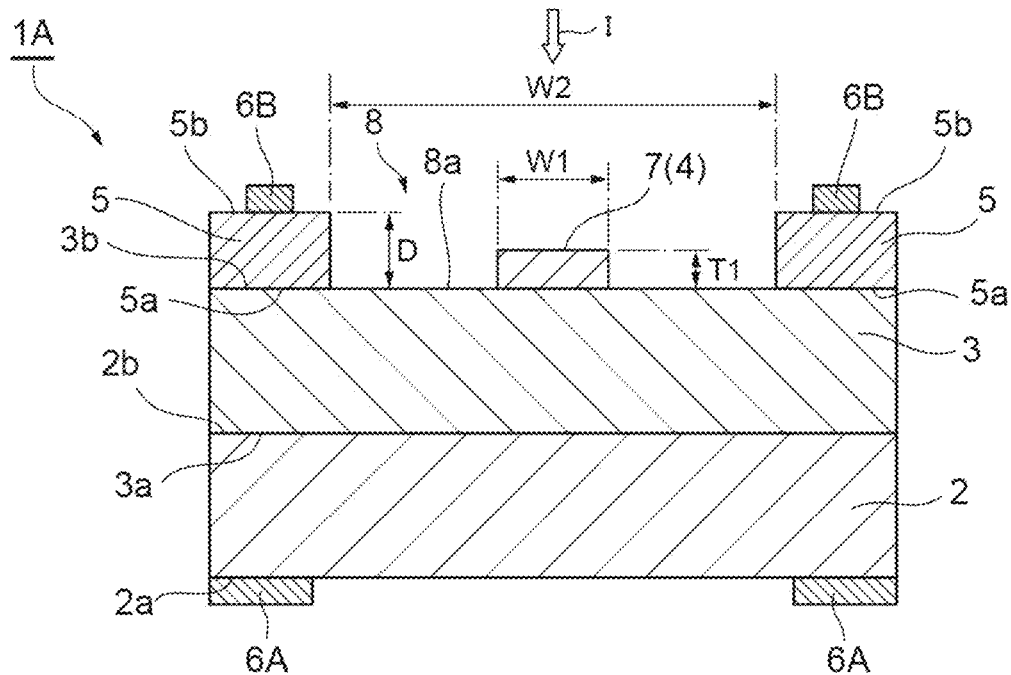
FIG. 1A is a schematic cross-sectional view showing the configuration of a photodetector according to a first embodiment of the invention.
Figure 1B:
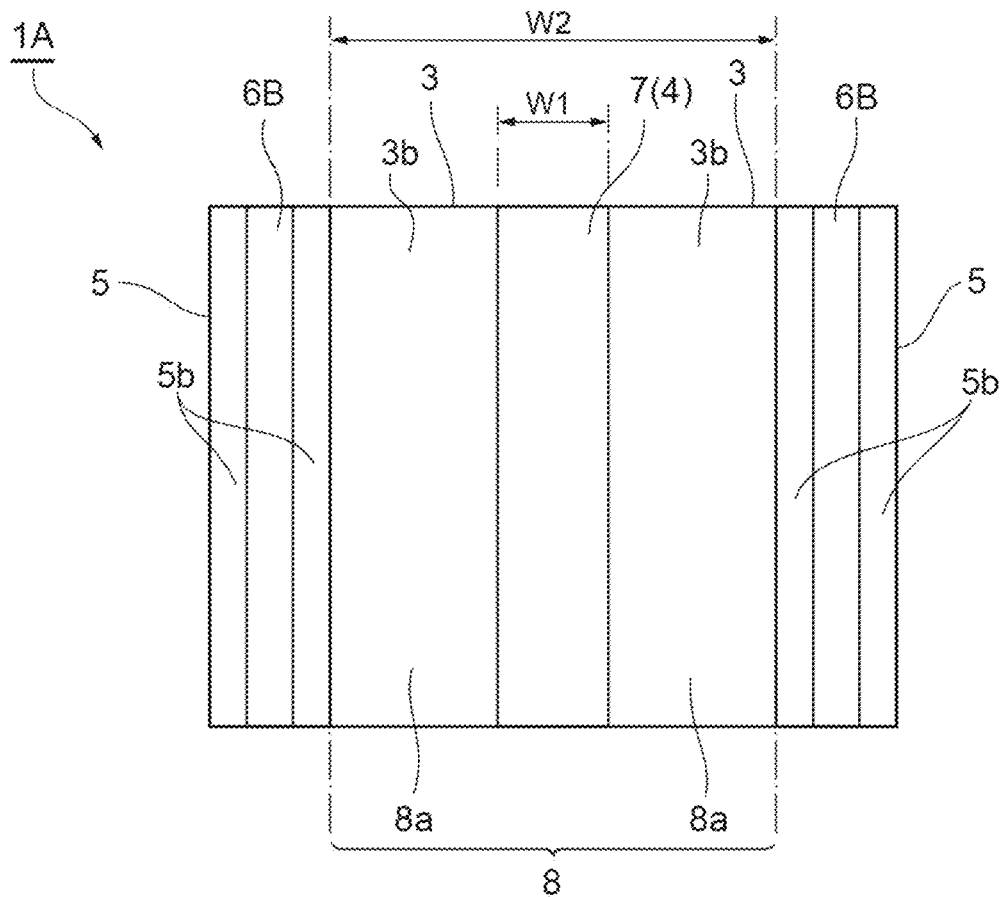
FIG. 1B is a plan view of FIG. 1A.

FIG. 1A is a schematic cross-sectional view showing the configuration of a photodetector according to a first embodiment of the invention, and FIG. 1B is a plan view of FIG. 1A. As shown in FIGS. 1A and 1B, a photodetector 1A according to the first embodiment is configured to include a first conductive type semiconductor layer 2, a semiconductor light absorption layer 3, a scatterer 4, a second conductive type semiconductor layer 5, and extraction electrodes 6A and 6B. In the present embodiment, for the sake of convenience, the first conductive type semiconductor layer 2 side is defined as the back surface side of the photodetector 1A, and the second conductive type semiconductor layer 5 side is defined as the surface side of the photodetector 1A. In the example of FIG. 1A, the photodetector 1A is a surface incidence type detector in which incident light I is incident from the surface side, but the photodetector of the invention may be any of the surface incidence type detector and the back surface incidence type detector.

In the photodetector 1A, when light having a wavelength longer than the absorption edge wavelength of the semiconductor (wavelength of light having energy exceeding the band gap) is incident as the incident light I, the surface plasmon is excited by the incident light I. The resonance of the surface plasmon causes a localized non-uniform electric field. In the photodetector 1A, by using the effect of the localized non-uniform electric field, a direct optical transition in the semiconductor is possible. Therefore, sufficient light absorption in the semiconductor can occur. In the photodetector 1A, since the light absorption occurring in the semiconductor is extracted to the outside as a photocurrent, light detection for a wavelength longer than the absorption edge wavelength of the semiconductor can be realized. Here, assuming that the wavelength of the incident light I to be detected is in the vicinity of 1200 nm, the dimensions and the like of each component of the photodetector 1A are illustrated.

The first conductive type semiconductor layer 2 is formed of, for example, Si whose conductive type is n-type. The first conductive type semiconductor layer 2 is formed of a low resistance semiconductor ($n^+$) having a high carrier concentration. The first conductive type semiconductor layer 2 has a rectangular shape in a plan view. The first conductive type semiconductor layer 2 has a first surface $2a$ and a second surface $2b$ opposite to the first surface $2a$. The first surface $2a$ is a surface facing the back surface side of the photodetector 1A. The second surface $2b$ is a surface facing the surface side of the photodetector 1A. The thickness of the first conductive type semiconductor layer 2 is, for example, 1 μm or more and 50 μm or less.

The semiconductor light absorption layer 3 is formed of, for example, Si whose conductive type is p-type. The semiconductor light absorption layer 3 is formed of a high resistance semiconductor ($p^-$) having a low carrier concentration. The semiconductor light absorption layer 3 has a rectangular shape in a plan view. The semiconductor light absorption layer 3 has a first surface $3a$ and a second surface $3b$ opposite to the first surface $3a$. The first surface $3a$ is a surface facing the back surface side of the photodetector 1A. The second surface $3b$ is a surface facing the surface side of the photodetector 1A. The semiconductor light absorption layer 3 is provided so as to cover the entire surface of the second surface 2b of the first conductive type semiconductor layer 2. The thickness of the semiconductor light absorption layer 3 is determined according to the carrier concentrations of the first conductive type semiconductor layer 2 and the semiconductor light absorption layer 3. The thickness of the semiconductor light absorption layer 3 is, for example, 50 nm or more and 100 µm or less. A pn junction of a semiconductor is formed at the interface between the semiconductor light absorption layer 3 and the first conductive type semiconductor layer 2.

The scatterer 4 is a structure that forms a localized non-uniform electric field inside the semiconductor light absorption layer 3 by scattering the incident light I. The scatterer 4 is formed of a material having a refractive index different from that of at least a part of peripheral elements. Specifically, the scatterer 4 is formed of a material having a refractive index different from that of at least one of the semiconductor light absorption layer 3 and air. Here, the scatterer 4 is formed by a metal nanostructure 7 that causes surface plasmon resonance in the vicinity of the interface between the scatterer 4 and the semiconductor light absorption layer 3 by the incidence of the incident light I. Examples of the metal material forming the metal nanostructure 7 include gold (Au), silver (Ag), copper (Cu), and aluminum (Al). The metal nanostructure 7 may be formed of a compound material containing these metals.

In the example of FIGS. 1A and 1B, the metal nanostructure 7 is provided with a width W equal to or less than the wavelength of the incident light I so as to be in contact with the second surface 3b of the semiconductor light absorption layer 3. The width W1 of the metal nanostructure 7 is, for example, 20 nm or more and 500 nm or less. The thickness T1 of the metal nanostructure 7 is smaller than the thickness of the semiconductor light absorption layer 3, and is, for example, 10 nm or more and 500 nm or less. The metal nanostructure 7 has a rectangular shape in a plan view. The metal nanostructure 7 extends linearly in one direction of the in-plane direction of the second surface 3b so as to extend from one side to the other side of the second surface 3b of the semiconductor light absorption layer 3. When the wavelength of the incident light I is around 1200 nm, for example, assuming that the width W1 of the metal nanostructure 7 is 100 nm and the thickness T1 of the metal nanostructure 7 is 100 nm, surface plasmon resonance caused by the incident light I can appropriately occur in the vicinity of the interface between the scatterer 4 and the semiconductor light absorption layer 3.

The second conductive type semiconductor layer 5 is formed of, for example, Si whose conductive type is p-type. The second conductive type semiconductor layer 5 is formed of a low resistance semiconductor ($p^+$) having a high carrier concentration. The second conductive type semiconductor layer 5 has a rectangular shape in a plan view. The second conductive type semiconductor layer 5 has a first surface 5a and a second surface 5b opposite to the first surface 5a. The thickness of the second conductive type semiconductor layer 5 is larger than the thickness T1 of the metal nanostructure 7, and is, for example, 100 nm or more and 1000 nm or less. A recess 8 is provided in a central portion of the second conductive type semiconductor layer 5. The depth D of the recess 8 is equal to the thickness of the second conductive type semiconductor layer 5. The second surface 3b of the semiconductor light absorption layer 3 and the metal nanostructure 7 on the second surface 3b are exposed on a bottom surface 8a of the recess 8.

The recess 8 extends linearly in one direction of the in-plane direction of the second surface 3b so as to extend from one side to the other side of the second surface 3b of the semiconductor light absorption layer 3 in a plan view. The width W2 of the recess 8 is sufficiently larger than the width W1 of the metal nanostructure 7. The second conductive type semiconductor layer 5 interposes the metal nanostructure 7 in its width direction and is arranged apart from the metal nanostructure 7 in a plan view. The separation width between the second conductive type semiconductor layer 5 and the metal nanostructure 7 is not particularly limited, but is larger than, for example, the width W1 of the metal nanostructure 7.

The extraction electrodes 6A and 6B are electrodes for extracting the photocurrent generated in the semiconductor light absorption layer 3 due to the formation of the localized non-uniform electric field. The extraction electrode 6A is an electrode layer that functions as an anode of the photodetector 1A. The extraction electrode 6A is provided on the first surface 2a side of the first conductive type semiconductor layer 2. The extraction electrode 6A has a rectangular shape in a plan view. The extraction electrode 6A extends linearly in one direction of the in-plane direction of the first surface 2a so as to extend from one side to the other side of the first surface 2a of the first conductive type semiconductor layer 2, for example, at a position overlapping the second conductive type semiconductor layer 5. The extraction electrode 6A is formed of a metal such as aluminum (Al), titanium (Ti), or indium (In). The extraction electrode 6A may be formed of a compound material containing these metals. The extraction electrode 6A is not limited to having a single layer, and may be formed so as to have a plurality of layers.

The extraction electrode 6B is an electrode layer that functions as a cathode of the photodetector 1A. The extraction electrode 6B is provided on the second surface 5b side of the second conductive type semiconductor layer 5. As described above, the second conductive type semiconductor layer 5 is arranged sufficiently apart from the metal nanostructure 7. Therefore, the extraction electrode 6B on the second conductive type semiconductor layer 5 is also arranged sufficiently apart from the metal nanostructure 7. Similar to the extraction electrode 6A, the extraction electrode 6B has a rectangular shape in a plan view. The extraction electrode 6B extends linearly in one direction of the in-plane direction of the second surface 5b so as to extend from one side to the other side of the second surface 5b of the second conductive type semiconductor layer 5. The extraction electrode 6B is formed of a metal such as gold (Au), aluminum (Al), or platinum (Pt). The extraction electrode 6B may be formed of a compound material containing these metals. The extraction electrode 6B is not limited to having a single layer, and may be formed so as to have a plurality of layers.

As described above, in the photodetector 1A, the scatterer 4 that forms a localized non-uniform electric field inside the semiconductor light absorption layer 3 by scattering the incident light I is provided with a width equal to or less than the wavelength of the incident light I so as to be in contact with the semiconductor light absorption layer 3. Therefore, since the position where the localized non-uniform electric field is generated and the position of a depletion layer in the semiconductor light absorption layer can be matched or brought close to each other, the effect of the localized non-uniform electric field in the semiconductor light absorption layer 3 can be sufficiently obtained. As a result, it is possible to improve the detection sensitivity.

In the photodetector 1A, the extraction electrodes 6A and 6B for extracting the photocurrent generated in the semiconductor light absorption layer 3 due to the formation of the localized non-uniform electric field are provided apart from the scatterer 4. With such a configuration, the scatterer 4 does not contribute to the extraction of the photocurrent and has only the function of forming a localized non-uniform electric field. Therefore, the generation of dark current due to the Schottky junction can be suppressed as compared with a case where the semiconductor light absorption layer 3 and the extraction electrodes 6A and 6B are in contact with each other or a case where the scatterer 4 itself serves as an extraction electrode.

In the photodetector 1A, the scatterer 4 is the metal nanostructure 7 that causes surface plasmon resonance in the vicinity of the interface between the scatterer 4 and the semiconductor light absorption layer 3. When the scatterer 4 is formed by the metal nanostructure 7, the scatterer 4 can be formed at a desired position with high reproducibility by nano-patterning. Therefore, it is possible to increase the manufacturing yield of the photodetector 1A.

Second Embodiment of Photodetector

Figure 2A:
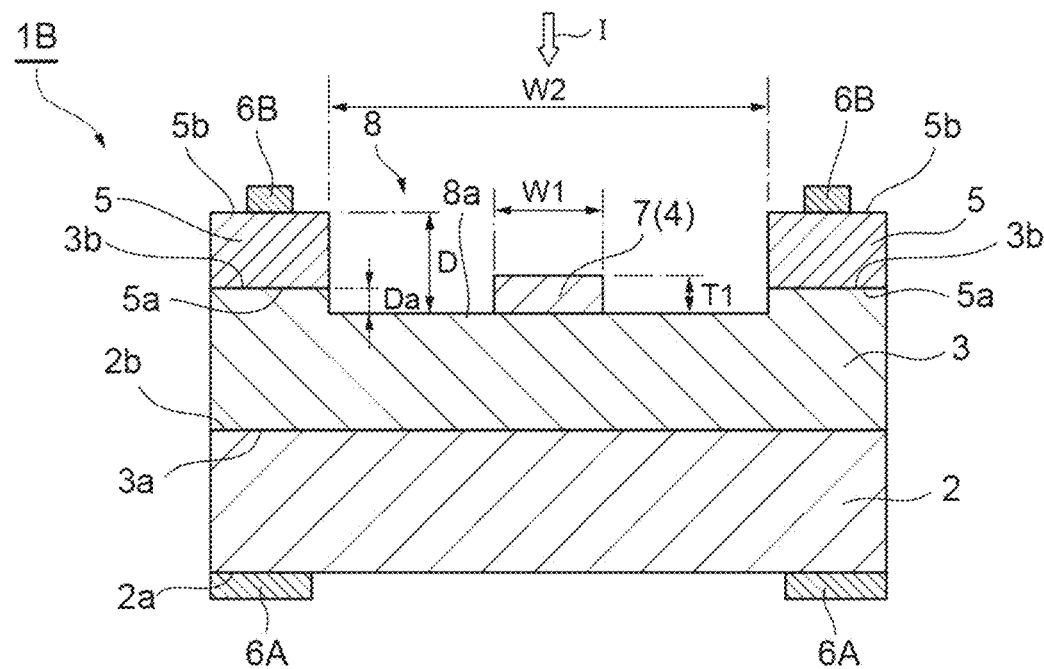
FIG. 2A is a schematic cross-sectional view showing the configuration of a photodetector according to a second embodiment of the invention.
Figure 2B:
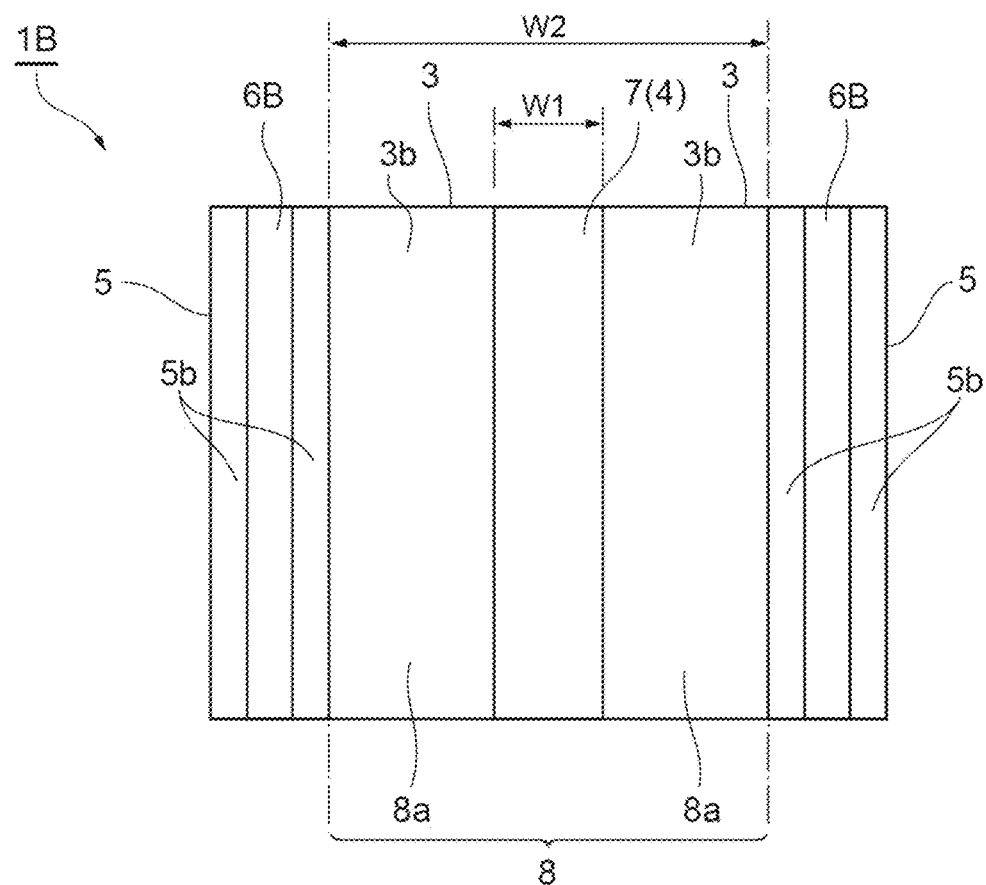
FIG. 2B is a plan view of FIG. 2A.

FIG. 2A is a schematic cross-sectional view showing the configuration of a photodetector according to a second embodiment of the invention, and FIG. 2B is a plan view of FIG. 2A. As shown in FIGS. 2A and 2B, a photodetector 1B according to the second embodiment is different from the photodetector 1A according to the first embodiment in that the recess 8 of the second conductive type semiconductor layer 5 penetrates the second conductive type semiconductor layer 5 and cuts out a part of the semiconductor light absorption layer 3.

The metal nanostructure 7 is arranged on the bottom surface 8a of the recess 8. The metal nanostructure 7 is located on a surface of the semiconductor light absorption layer 3 that is one step lower than the surface on which the second conductive type semiconductor layer 5 is provided. In the example of FIG. 2A, in the photodetector 1B, the depth Da of a notched portion of the semiconductor light absorption layer 3 due to the recess 8 is equal to or less than the thickness T1 of the metal nanostructure 7 that is the scatterer 4. Therefore, in the photodetector 1B, the metal nanostructure 7 arranged on the bottom surface 8a of the recess 8 slightly protrudes toward the second conductive type semiconductor layer 5 side from the surface on which the second conductive type semiconductor layer 5 is provided. The depth Da of the notched portion of the semiconductor light absorption layer 3 due to the recess 8 may be larger than the thickness T1 of the metal nanostructure 7 that is the scatterer 4.

Also in such a photodetector 1B, the scatterer 4 is provided with a width equal to or less than the wavelength of the incident light I so as to be in contact with the semiconductor light absorption layer 3. For this reason, the position where the localized non-uniform electric field is generated and the position of the depletion layer in the semiconductor light absorption layer can be matched or brought close to each other. Therefore, since the effect of the localized non-uniform electric field in the semiconductor light absorption layer 3 can be sufficiently obtained, it is possible to improve the detection sensitivity. Also in the photodetector 1B, the extraction electrodes 6A and 6B are provided apart from the scatterer 4. Therefore, it is possible to suppress the generation of dark current due to the Schottky junction.

In the photodetector 1B, the recess 8 that penetrates the second conductive type semiconductor layer 5 and cuts out a part of the semiconductor light absorption layer 3 is provided in the second conductive type semiconductor layer 5, and the scatterer 4 is arranged on the bottom surface 8a of the recess 8. According to this configuration, the scatterer 4 and the interface of the pn junction between the first conductive type semiconductor layer 2 and the semiconductor light absorption layer 3 can be brought close to each other according to the depth of the recess 8. Therefore, since the path of the photocurrent generated in the semiconductor light absorption layer 3 is shortened, it is possible to realize a high-speed response for photodetection.

Third Embodiment of Photodetector

Figure 3A:
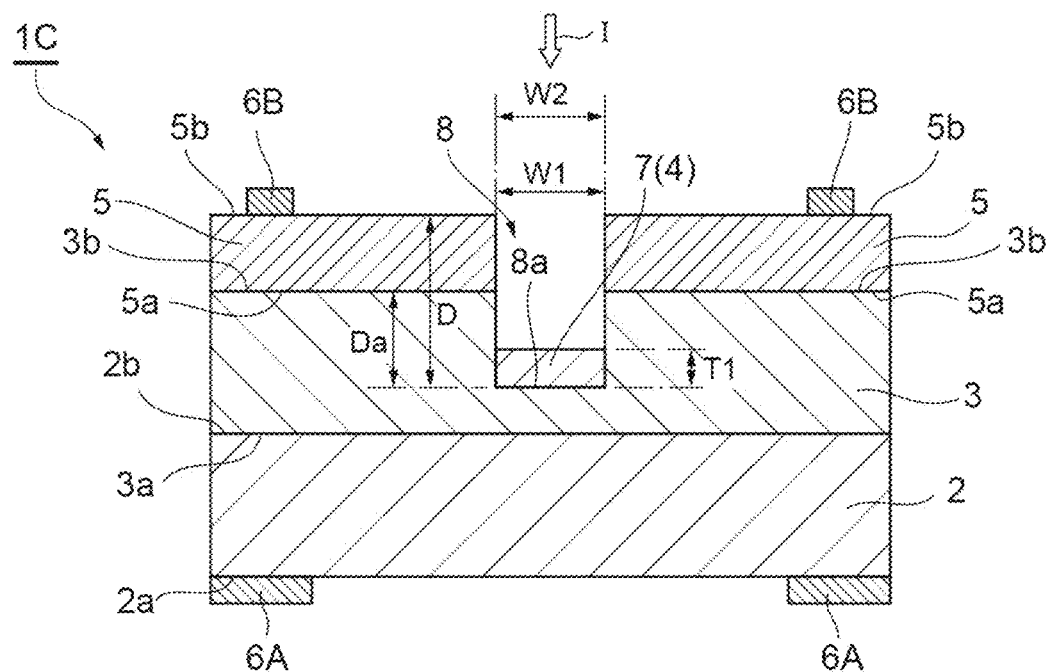
FIG. 3A is a schematic cross-sectional view showing the configuration of a photodetector according to a third embodiment of the invention.
Figure 3B:
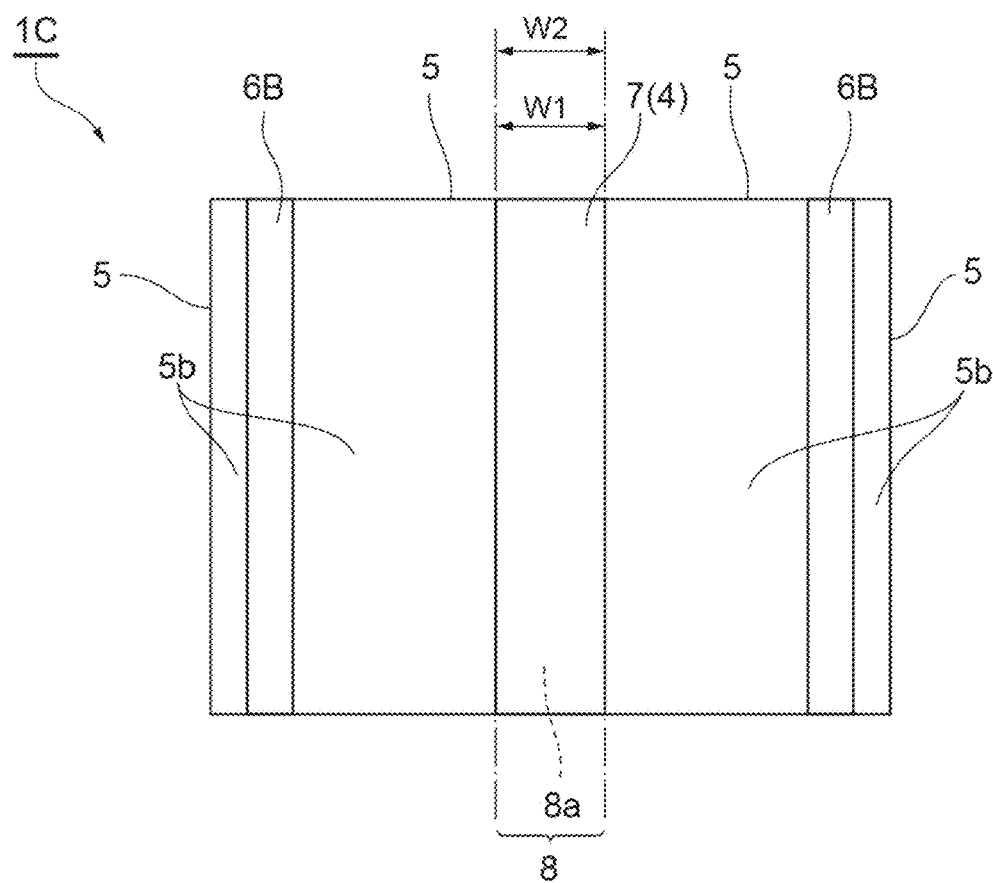
FIG. 3B is a plan view of FIG. 3A.

FIG. 3A is a schematic cross-sectional view showing the configuration of a photodetector according to a third embodiment of the invention, and FIG. 3B is a plan view of FIG. 3A. As shown in FIGS. 3A and 3B, a photodetector 1C according to the third embodiment is different from the photodetector 1B according to the second embodiment in that the width W2 of the recess 8 is equal to or less than the wavelength of the incident light I over the entire depth direction.

In the photodetector 1C, the width W1 of the metal nanostructure 7 is equal to or less than the wavelength of the incident light I. In the photodetector 1C, the width W2 of the recess 8 is equal to the width W1 of the metal nanostructure 7. In the photodetector 1C, the depth Da of a notched portion of the semiconductor light absorption layer 3 due to the recess 8 is larger than the thickness T1 of the metal nanostructure 7 that is the scatterer 4. Therefore, in the photodetector 1C, the metal nanostructure 7 arranged on the bottom surface 8a of the recess 8 does not protrude toward the second conductive type semiconductor layer 5 side from the surface on which the second conductive type semiconductor layer 5 is provided, and is embedded in the semiconductor light absorption layer 3.

Also in such a photodetector 1C, the scatterer 4 is provided with a width equal to or less than the wavelength of the incident light I so as to be in contact with the semiconductor light absorption layer 3. For this reason, the position where the localized non-uniform electric field is generated and the position of the depletion layer in the semiconductor light absorption layer can be matched or brought close to each other. Therefore, since the effect of the localized non-uniform electric field in the semiconductor light absorption layer 3 can be sufficiently obtained, it is possible to improve the detection sensitivity. Also in the photodetector 1C, the extraction electrodes 6A and 6B are provided apart from the scatterer 4. Therefore, it is possible to suppress the generation of dark current due to the Schottky junction.

In the photodetector 1C, the depletion layer can be expanded inside the semiconductor light absorption layer 3 by adjusting the carrier concentrations of the first conductive type semiconductor layer 2 and the semiconductor light absorption layer 3. As an example, in the photodetector 1C, assuming that the carrier concentration of the first conductive type semiconductor layer 2 is $1 \times 10^{19}$ cm' or more and the carrier concentration of the semiconductor light absorption layer 3 is $1 \times 10^{16}$ cm$^{-3}$ or less, a depletion layer can be formed over 300 nm or more on the inner side of the semiconductor light absorption layer 3 from the interface between the semiconductor light absorption layer 3 and the first conductive type semiconductor layer 2, which is the interface of the pn junction. Therefore, since the position of the depletion layer can be matched to the region where the electric field changes abruptly due to the localized non-uniform electric field, it is possible to efficiently perform photoelectric conversion of the incident light I.

Fourth Embodiment of Photodetector

Figure 4A:
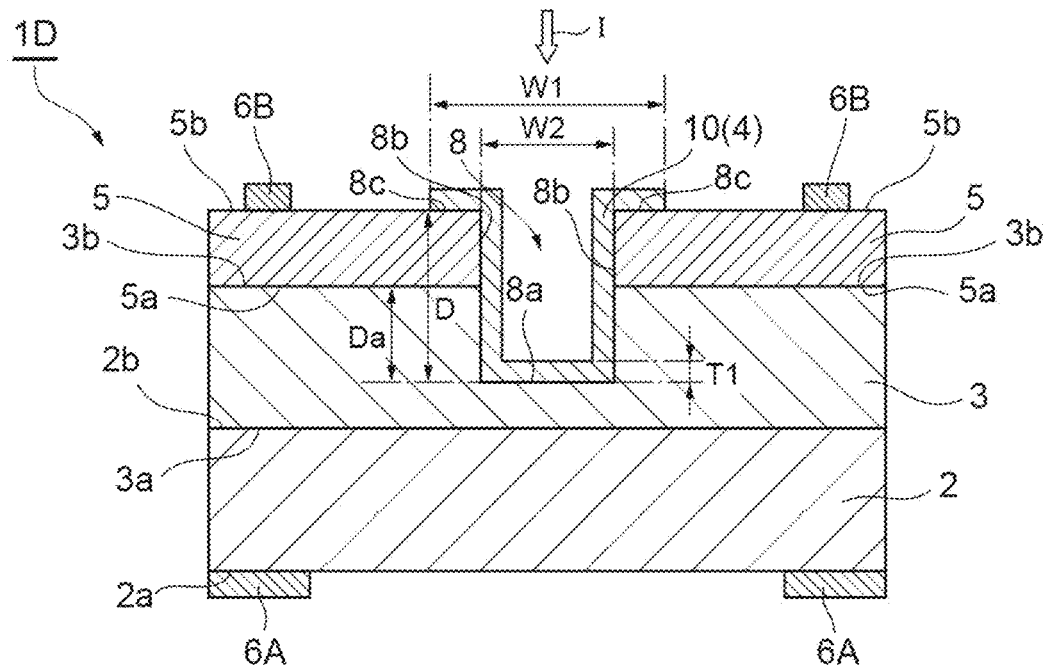
FIG. 4A is a schematic cross-sectional view showing the configuration of a photodetector according to a fourth embodiment of the invention.
Figure 4B:
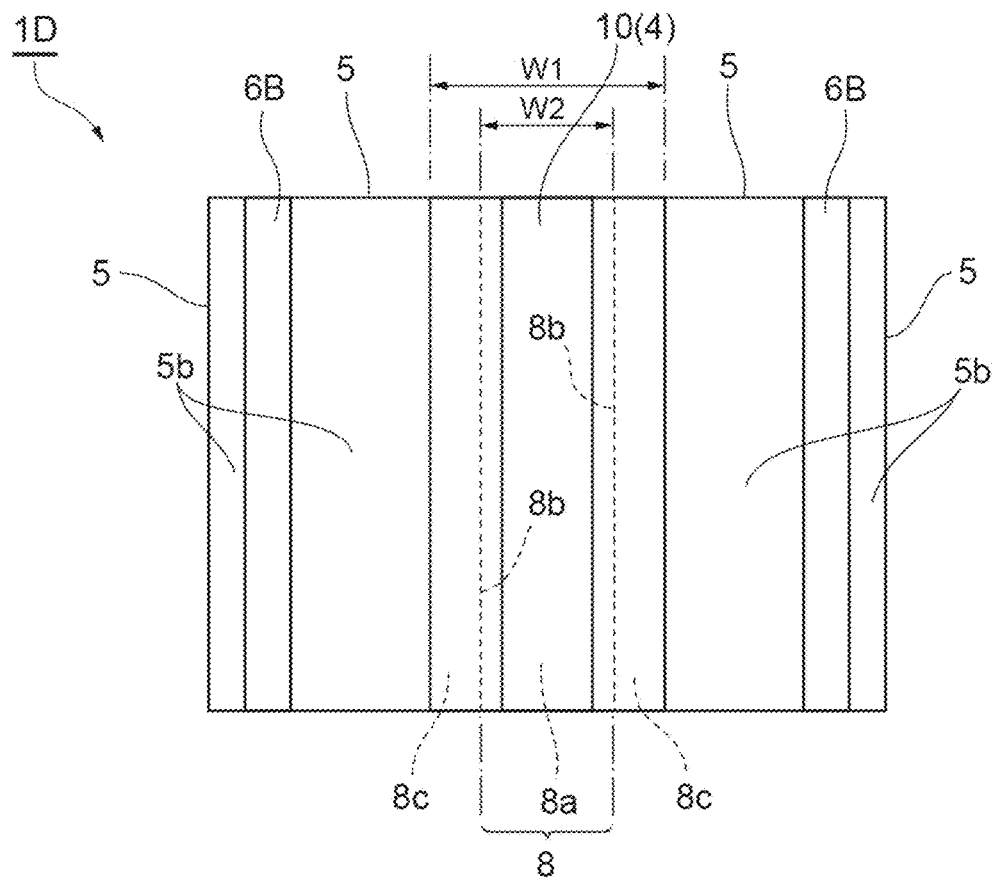
FIG. 4B is a plan view of FIG. 4A.

FIG. 4A is a schematic cross-sectional view showing the configuration of a photodetector according to a fourth embodiment of the invention, and FIG. 4B is a plan view of FIG. 4A. As shown in FIGS. 4A and 4B, a photodetector 1D according to the fourth embodiment is different from the photodetector 1C according to the third embodiment in that the scatterer 4 is arranged on the bottom surface 8a and the inner wall surface 8b of the recess 8. In the photodetector 1D, the scatterer 4 is formed by a non-conductive dielectric nanostructure 10 instead of the metal nanostructure 7.

In the photodetector 1D, the width W2 of the recess 8 is equal to or less than the wavelength of the incident light I over the entire depth direction, while the dielectric nanostructure 10 is arranged on the bottom surface 8a and the inner wall surface 8b of the recess 8. In the photodetector 1D, the dielectric nanostructure 10 overhangs the second surface 5b side of the second conductive type semiconductor layer 5 and extends along an opening edge 8c of the recess 8. The width W1 of the dielectric nanostructure 10 is larger than the width W2 of the recess 8, but is equal to or less than the wavelength of the incident light I. Also in such a photodetector 1D, the same operational effect as in the third embodiment is obtained. In addition, according to this configuration, since lift-off using a resist for nano-patterning is not required for forming the scatterer 4, the ease of manufacturing the photodetector 1D can be improved.

Fifth Embodiment of Photodetector

Figure 5A:
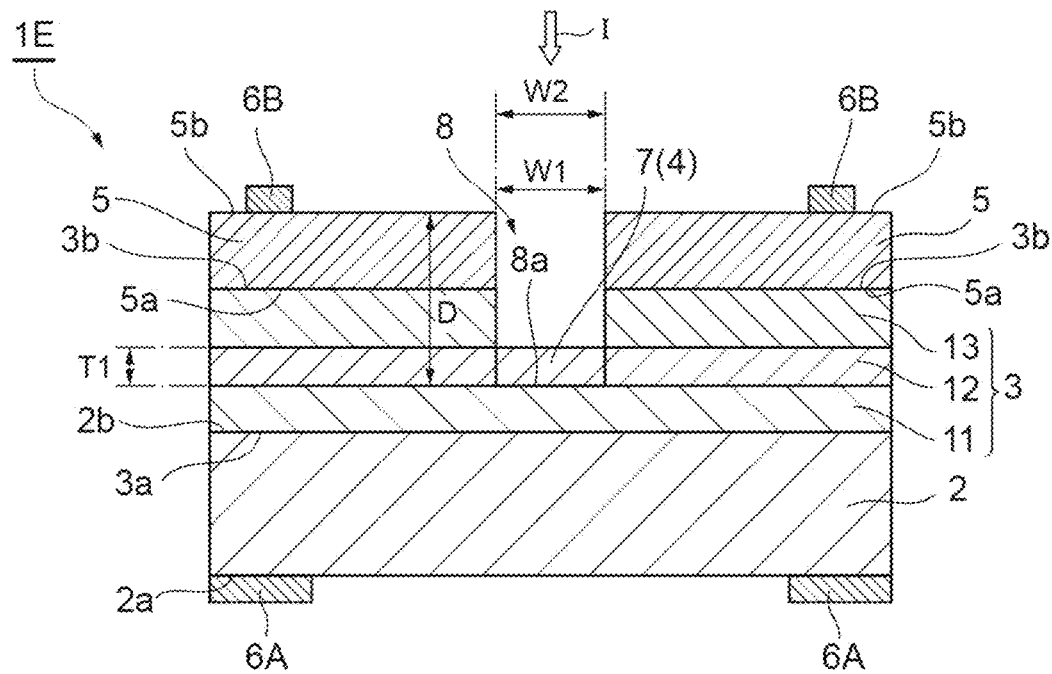
FIG. 5A is a schematic cross-sectional view showing the configuration of a photodetector according to a fifth embodiment of the invention.
Figure 5B:
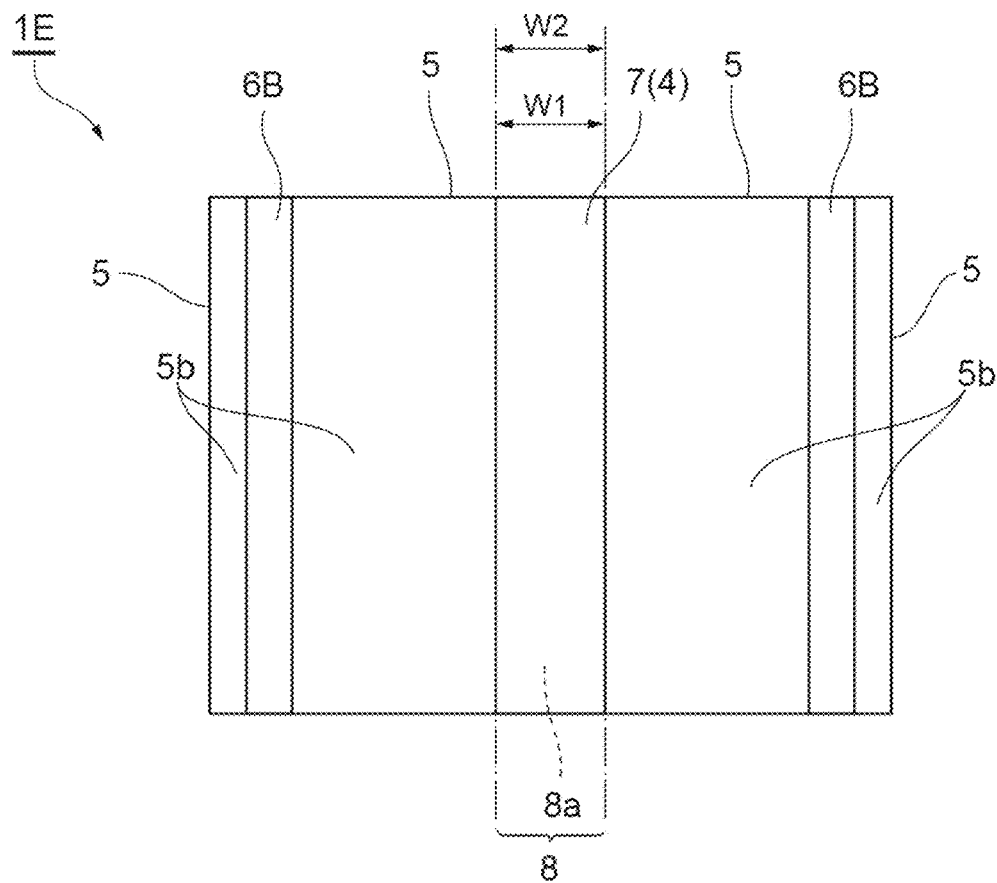
FIG. 5B is a plan view of FIG. 5A.

FIG. 5A is a schematic cross-sectional view showing the configuration of a photodetector according to a fifth embodiment of the invention, and FIG. 5B is a plan view of FIG. 5A. As shown in FIGS. 5A and 5B, a photodetector 1E according to the fifth embodiment is different from the photodetector 1C according to the third embodiment in terms of the configuration of the semiconductor light absorption layer 3.

In the photodetector 1E, the width W2 of the recess 8 is equal to or less than the wavelength of the incident light I over the entire depth direction, while the pn junction of the semiconductor is replaced with a pin junction. Specifically, the semiconductor light absorption layer 3 includes a first layer 11 that is a high resistance semiconductor layer whose conductive type is p-type, a second layer 12 that is a semiconductor layer whose conductive type is i-type, and a third layer 13 that is a high resistance semiconductor layer whose conductive type is n-type. The first layer 11 is located on the first conductive type semiconductor layer 2 side. The third layer 13 is located on the second conductive type semiconductor layer 5 side. The second layer 12 is located between the first layer 11 and the third layer 13. The recess 8 is provided at a depth for cutting out a part of the second layer 12. The scatterer 4 is arranged on the bottom surface 8a of the recess 8 so as to be embedded in the second layer 12.

Also in such a photodetector 1E, the same operational effect as in the third embodiment is obtained. According to the configuration of the photodetector 1E, since the scatterer 4 is embedded in the second layer 12 whose conductive type is i-type and in which the depletion layer is located, the path of the photocurrent generated in the semiconductor light absorption layer 3 is shortened. Therefore, it is possible to realize a high-speed response for photodetection. In addition, since the position of the depletion layer can be matched to the region where the electric field changes abruptly due to the localized non-uniform electric field, it is possible to efficiently perform photoelectric conversion of the incident light I.

Sixth Embodiment of Photodetector

Figure 6A:
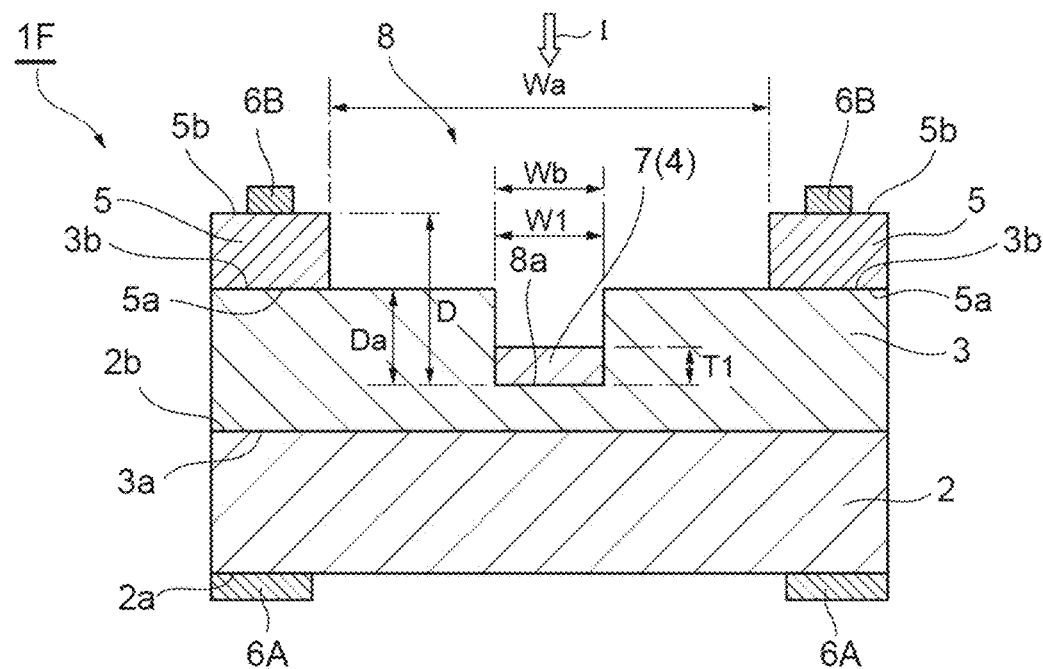
FIG. 6A is a schematic cross-sectional view showing the configuration of a photodetector according to a sixth embodiment of the invention.
Figure 6B:
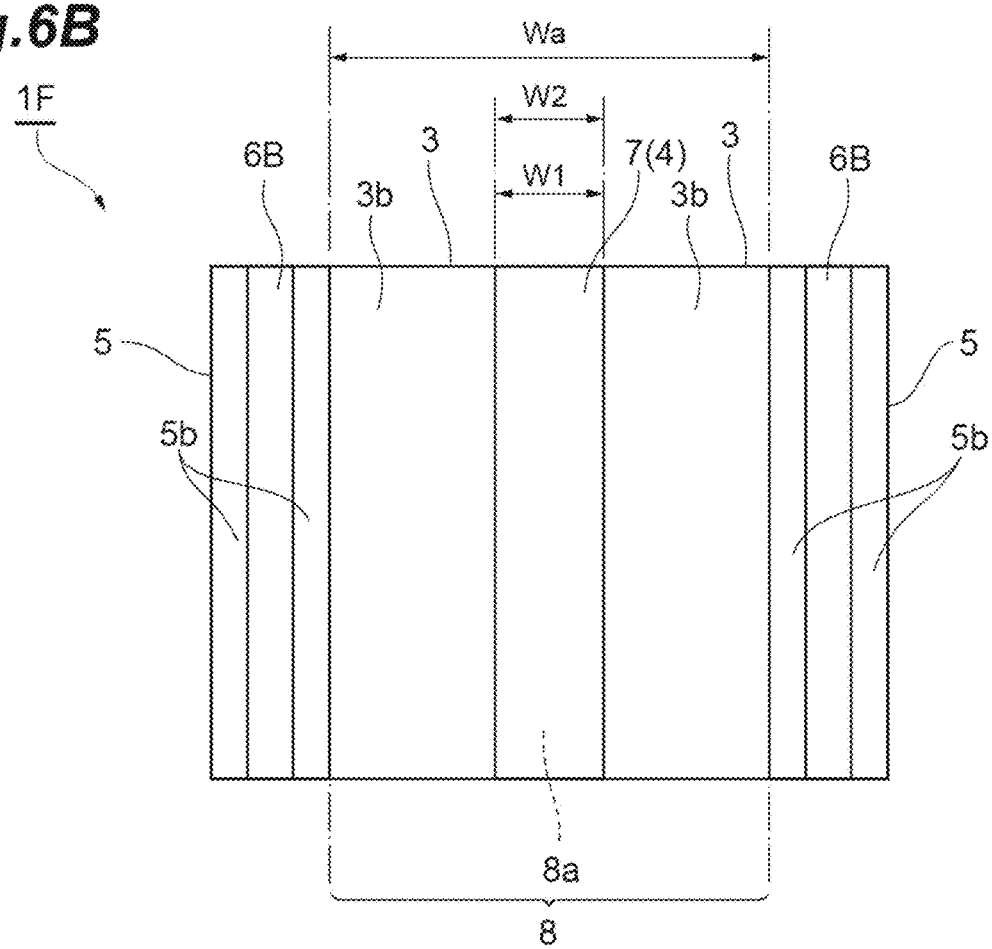
FIG. 6B is a plan view of FIG. 6A.

FIG. 6A is a schematic cross-sectional view showing the configuration of a photodetector according to a sixth embodiment of the invention, and FIG. 6B is a plan view of FIG. 6A. As shown in FIGS. 6A and 6B, a photodetector 1F according to the sixth embodiment is different from the photodetector 1B according to the second embodiment in terms of the configuration of the recess 8.

Specifically, in the photodetector 1F, the width W2a of a portion of the recess 8 that penetrates the second conductive type semiconductor layer 5 is larger than the width W2b of a portion of the recess 8 that cuts out a part of the semiconductor light absorption layer 3. The width W2a of the portion penetrating the second conductive type semiconductor layer 5 is sufficiently larger than the width W1 of the metal nanostructure 7, similar to the width W of the recess 8 in the second embodiment. The width W2b of the portion that cuts out a part of the semiconductor light absorption layer 3 is equal to or less than the wavelength of the incident light I, as in the third to fifth embodiments.

The depth Da of a notched portion of the semiconductor light absorption layer 3 due to the recess 8 is larger than the thickness T1 of the metal nanostructure 7 that is the scatterer 4, as in the third embodiment. Therefore, the metal nanostructure 7 arranged on the bottom surface 8a of the recess 8 does not protrude toward the second conductive type semiconductor layer 5 side from the surface on which the second conductive type semiconductor layer 5 is provided, and is embedded in the semiconductor light absorption layer 3. In the photodetector 1F, in addition to the operational effect described above, the loss of the incident light I due to the second conductive type semiconductor layer 5 (loss due to scattering) can be reduced because the width W2a of the portion penetrating the second conductive type semiconductor layer 5 is sufficiently larger than the width W1 of the metal nanostructure 7. The photodetector 1F is particularly suitable for the configuration of a surface incidence type photodetector in which light is incident from the second conductive type semiconductor layer 5 side.

Seventh Embodiment of Photodetector

Figure 7A:
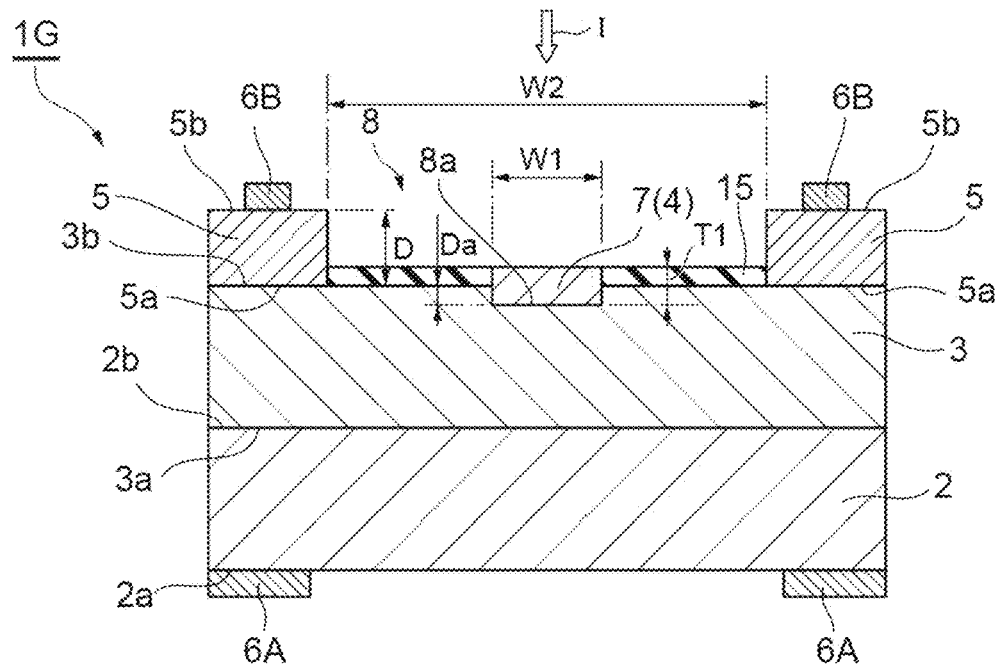
FIG. 7A is a schematic cross-sectional view showing the configuration of a photodetector according to a seventh embodiment of the invention.
Figure 7B:
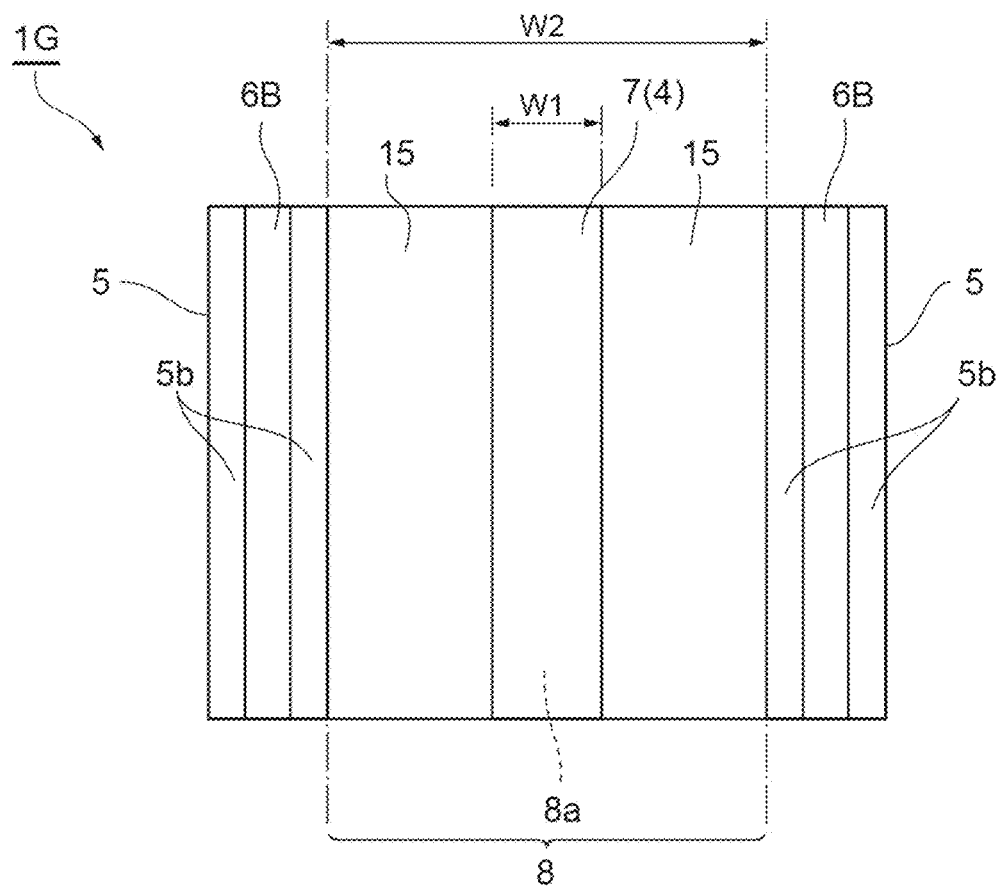
FIG. 7B is a plan view of FIG. 7A.

FIG. 7A is a schematic cross-sectional view showing the configuration of a photodetector according to a seventh embodiment of the invention, and FIG. 7B is a plan view of FIG. 7A. As shown in FIGS. 7A and 7B, a photodetector 1G according to the seventh embodiment is different from the photodetector 1F according to the sixth embodiment in that an insulating layer 15 is provided in the recess 8. The insulating layer 15 is formed of a material having a refractive index smaller than that of the semiconductor light absorption layer 3. As a material for forming the insulating layer 15, for example, silicon dioxide ($SiO_2$), silicon nitride (SiN), and aluminum oxide ($Al_2O_3$) can be used.

In the photodetector 1G, the depth D of a notched portion of the semiconductor light absorption layer 3 due to the recess 8 is smaller than the thickness T1 of the metal nanostructure 7 that is the scatterer 4. In the photodetector 1G, the metal nanostructure 7 arranged on the bottom surface 8a of the recess 8 slightly protrudes toward the second conductive type semiconductor layer 5 side from the surface on which the second conductive type semiconductor layer 5 is provided. The insulating layer 15 is provided on the entire surface of the second surface 3b of the semiconductor light absorption layer 3, which is exposed from the portion of the recess 8 that penetrates the second conductive type semiconductor layer 5, so as to be flush with the metal nanostructure 7 protruding toward the second conductive type semiconductor layer 5 side.

According to such a photodetector 1G, in addition to the effect described above, it is possible to protect the scatterer 4 or prevent leakage from the scatterer 4 by using the insulating layer 15. In the photodetector 1G, since the refractive index of the insulating layer 15 is smaller than the refractive index of the semiconductor light absorption layer 3, the localized non-uniform electric field can be concentrated on the semiconductor light absorption layer 3 having a relatively high refractive index. Therefore, it is possible to further improve the detection sensitivity.

Eighth Embodiment of Photodetector

Figure 8A:
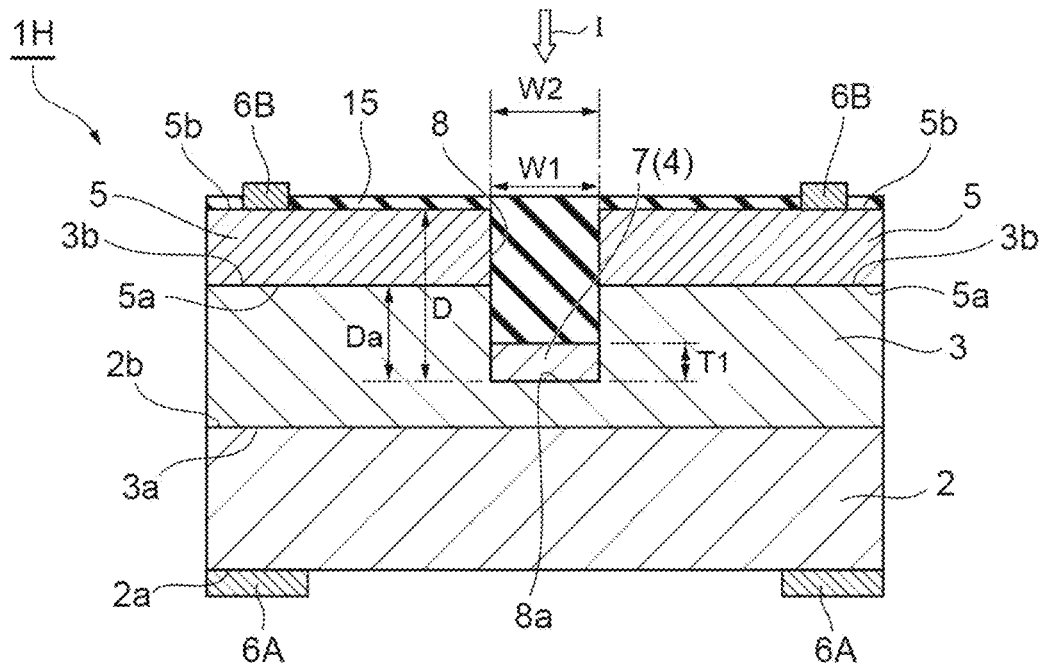
FIG. 8A is a schematic cross-sectional view showing the configuration of a photodetector according to an eighth embodiment of the invention.
Figure 8B:
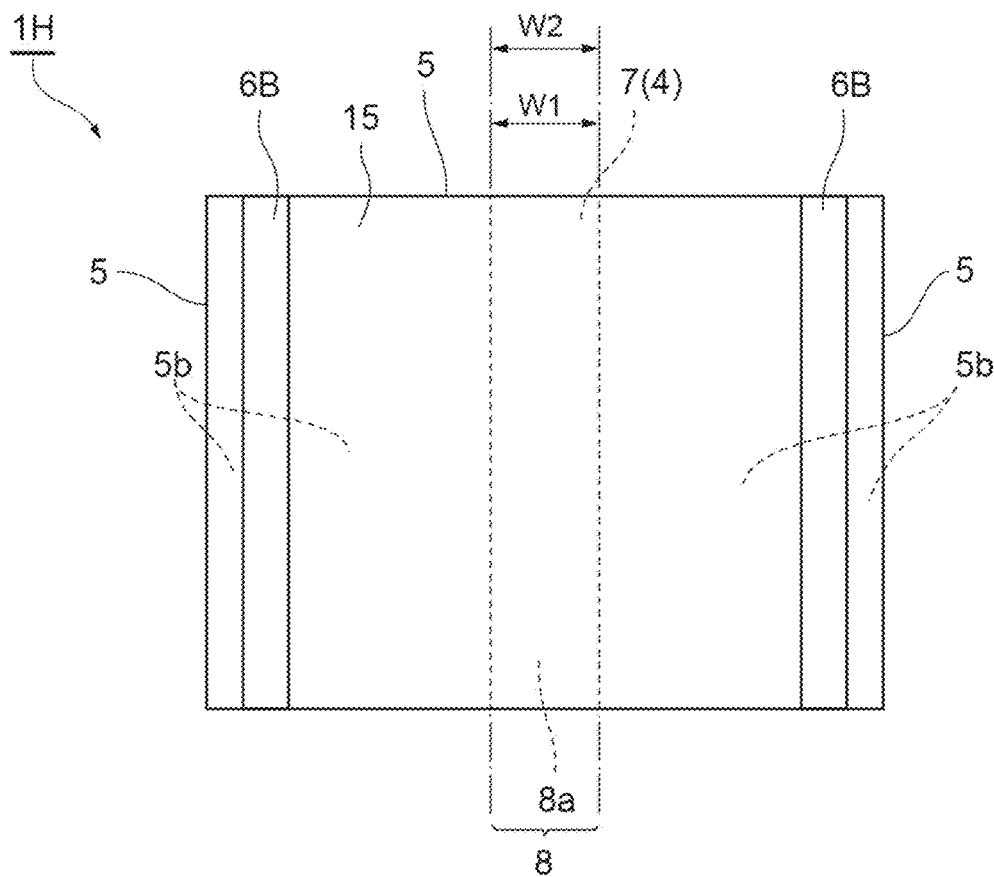
FIG. 8B is a plan view of FIG. 8A.

FIG. 8A is a schematic cross-sectional view showing the configuration of a photodetector according to an eighth embodiment of the invention, and FIG. 8B is a plan view of FIG. 8A. As shown in FIGS. 8A and 8B, a photodetector 1H according to the eighth embodiment is different from the photodetector 1C according to the third embodiment in that an insulating layer 15 is provided in the recess 8. The insulating layer 15 is formed of a material having a refractive index smaller than that of the semiconductor light absorption layer 3, as in the seventh embodiment. As a material for forming the insulating layer 15, for example, silicon dioxide ($SiO_2$), silicon nitride (SiN), and aluminum oxide ($Al_2O_3$) can be used.

In the photodetector 1H, the insulating layer 15 is filled in the recess 8. In the photodetector 1H, the metal nanostructure 7 arranged on the bottom surface 8a of the recess 8 is covered with the insulating layer 15. In the photodetector 1H, the insulating layer 15 is also provided on the entire surface of the second surface 5b of the second conductive type semiconductor layer 5 except for a region where the extraction electrode 6B is formed.

According to such a photodetector 1H, in addition to the effect described above, it is possible to protect the scatterer 4 or prevent leakage from the scatterer 4 by using the insulating layer 15. In the photodetector 1H, since the refractive index of the insulating layer 15 is smaller than the refractive index of the semiconductor light absorption layer 3, the localized non-uniform electric field can be concentrated on the semiconductor light absorption layer 3 having a relatively high refractive index. Therefore, it is possible to further improve the detection sensitivity.

Ninth Embodiment of Photodetector

Figure 9A:
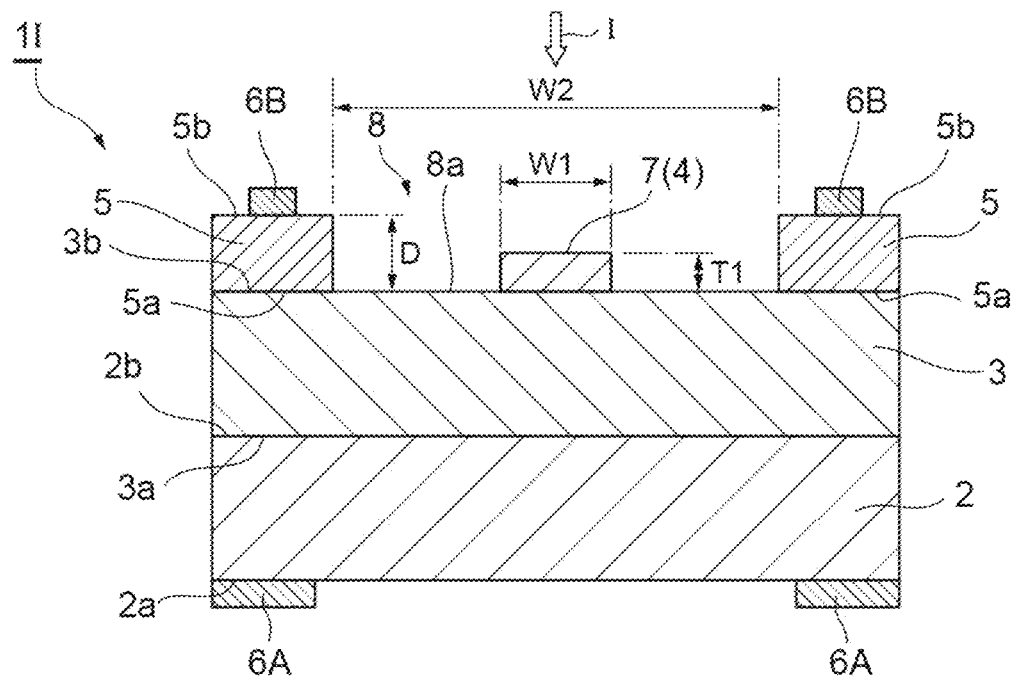
FIG. 9A is a schematic cross-sectional view showing the configuration of a photodetector according to a ninth embodiment of the invention.
Figure 9B:
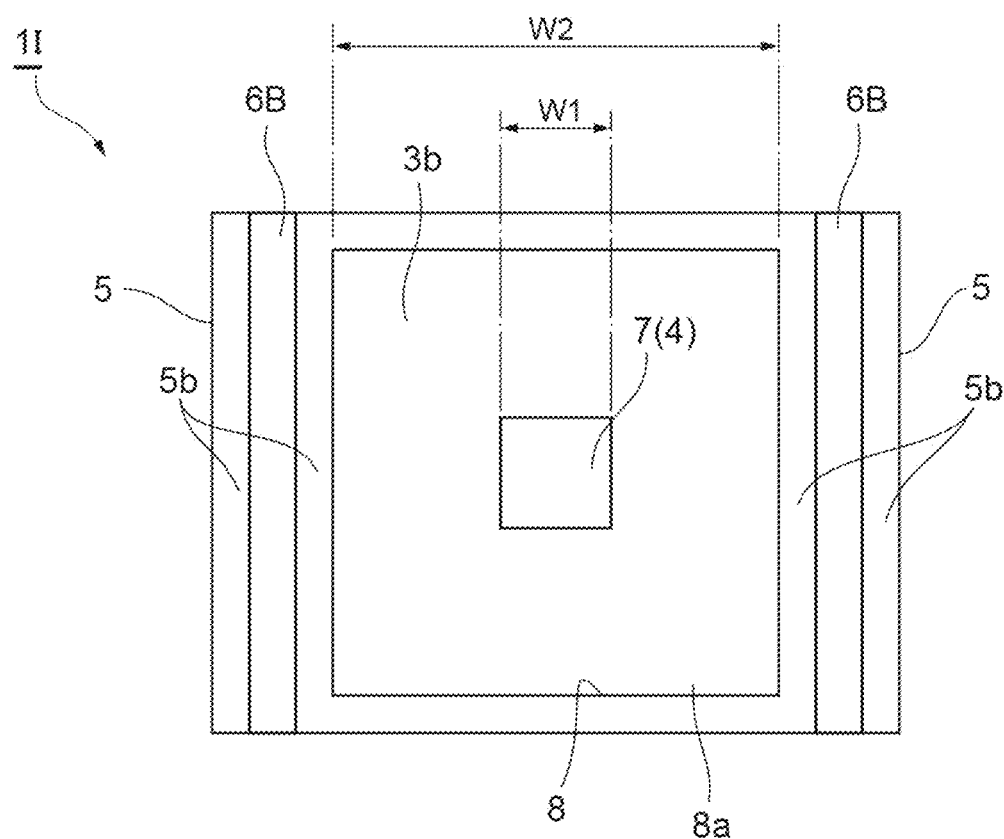
FIG. 9B is a plan view of FIG. 9A.

FIG. 9A is a schematic cross-sectional view showing the configuration of a photodetector according to a ninth embodiment of the invention, and FIG. 9B is a plan view of FIG. 9A. As shown in FIGS. 9A and 9B, a photodetector 1I according to the ninth embodiment is different from the photodetector 1A according to the first embodiment in terms of the planar shape of the recess 8.

In the photodetector 1I, the planar shape of the recess 8 is a square shape. In the first to eighth embodiments described above, the polarization direction of the incident light I corresponding to the resonance is only the width direction of the recess 8. However, in the photodetector 1I, the direction perpendicular to the width direction of the recess can also correspond to the resonance of the incident light I. Therefore, it is possible to detect the incident light I whose polarization directions are perpendicular to each other. The planar shape of the recess 8 is not limited to the square shape, and may be another shape such as a circular shape. The planar shape of the recess 8 shown in the ninth embodiment may be applied to the first to eighth embodiments.

Tenth Embodiment of Photodetector

Figure 10A:
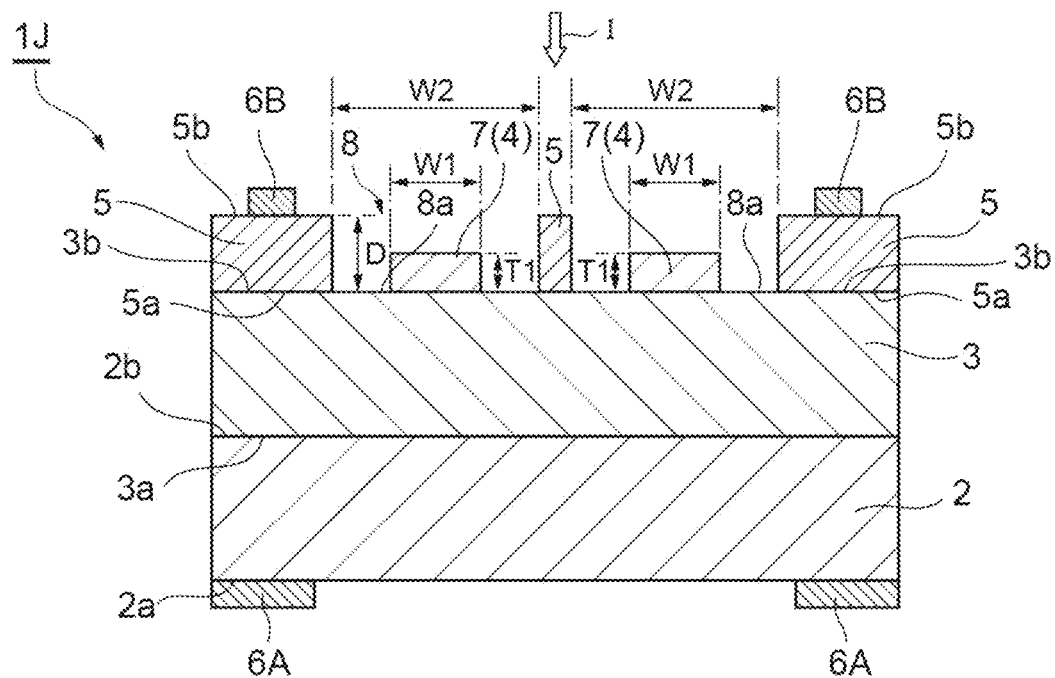
FIG. 10A is a schematic cross-sectional view showing the configuration of a photodetector according to a tenth embodiment of the invention.
Figure 10B:
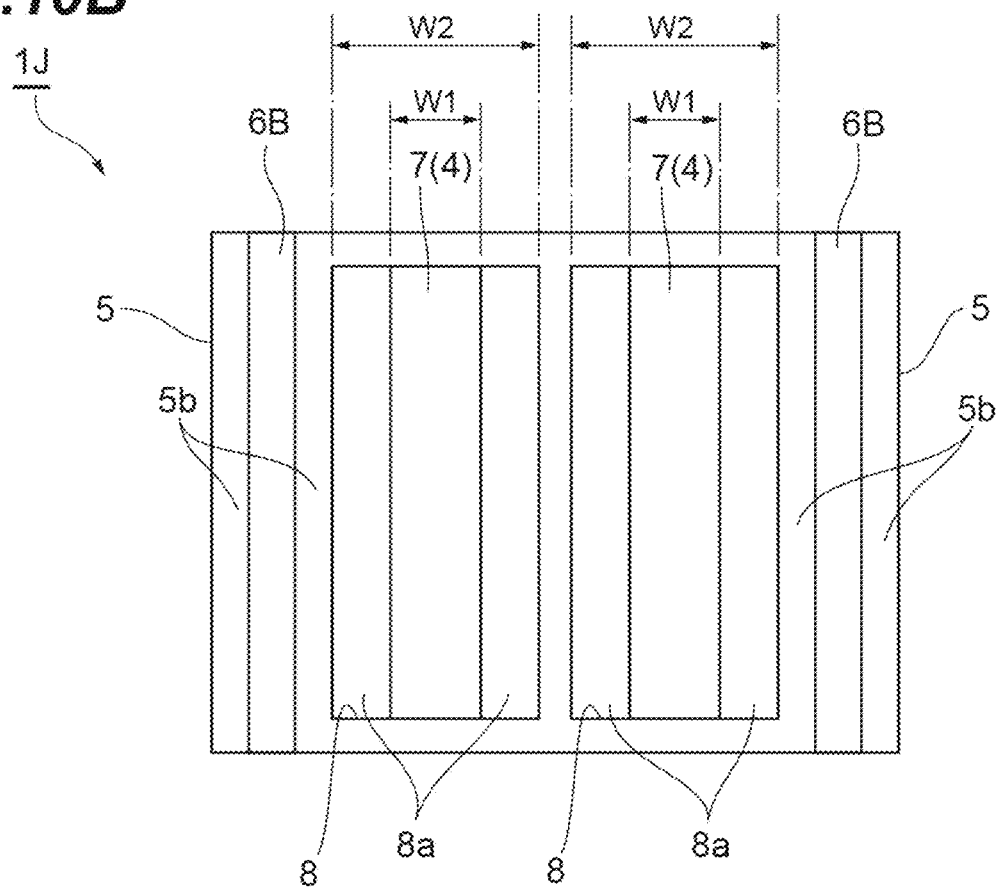
FIG. 10B is a plan view of FIG. 10A.

FIG. 10A is a schematic cross-sectional view showing the configuration of a photodetector according to a tenth embodiment of the invention, and FIG. 10B is a plan view of FIG. 10A. As shown in FIGS. 10A and 10B, a photodetector 1J according to the tenth embodiment is different from the photodetector 1A according to the first embodiment in that a plurality of scatterers 4 are arranged at predetermined distances in the in-plane direction of the interface between the scatterer 4 and the semiconductor light absorption layer 3.

Specifically, in the photodetector 1J, a plurality of (here, two) recesses 8 are arranged in the width direction of the metal nanostructure 7. The planar shape of each recess 8 is a rectangular shape extending along the extending direction of the metal nanostructure 7. Adjacent recesses 8 and 8 are apart from each other. The second conductive type semiconductor layer 5 is located between the recesses 8 and 8. According to such a photodetector 1J, since the light receiving region (area of the scatterer) of the incident light I is expanded, it is possible to improve the detection sensitivity. The arrangement of the scatterer 4 shown in the tenth embodiment may be applied to the first to eighth embodiments.

Eleventh Embodiment of Photodetector

Figure 11A:
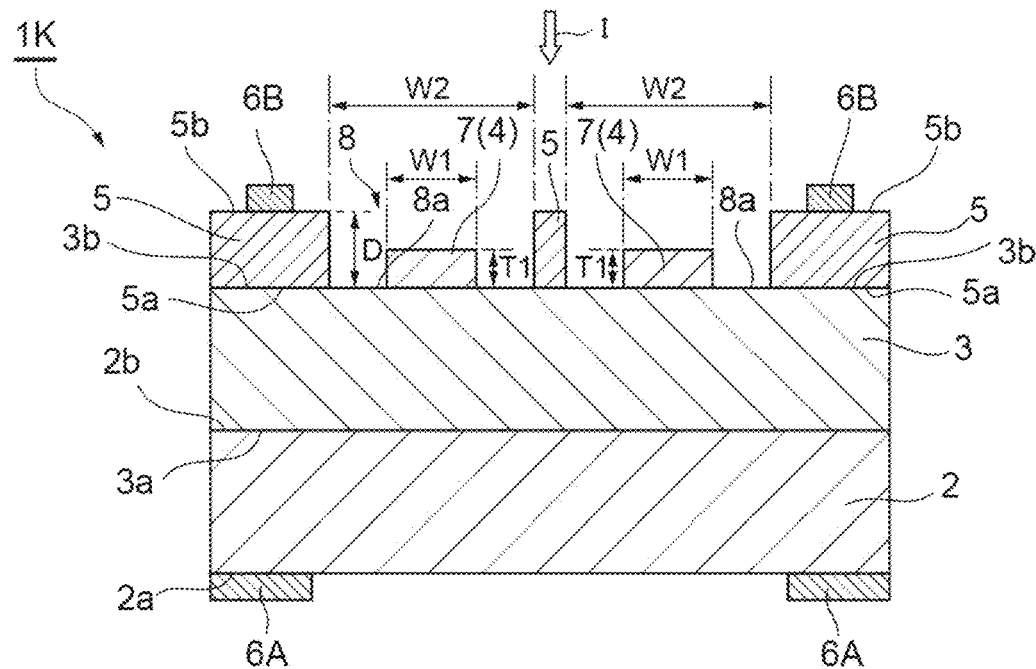
FIG. 11A is a schematic cross-sectional view showing the configuration of a photodetector according to an eleventh embodiment of the invention.
Figure 11B:
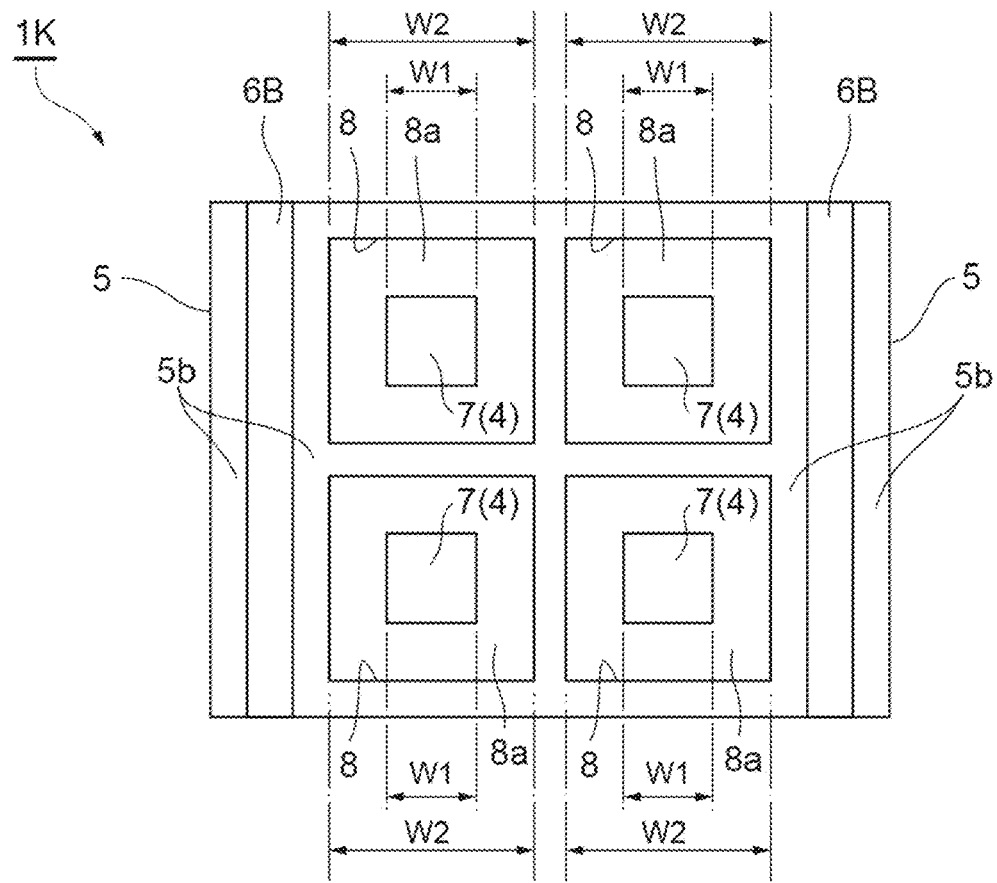
FIG. 11B is a plan view of FIG. 11A.

FIG. 11A is a schematic cross-sectional view showing the configuration of a photodetector according to an eleventh embodiment of the invention, and FIG. 11B is a plan view of FIG. 11A. As shown in FIGS. 11A and 11B, a photodetector 1K according to the eleventh embodiment is different from the photodetector 1I according to the ninth embodiment in that a plurality of scatterers 4 are arranged at predetermined distances in the in-plane direction of the interface between the scatterer 4 and the semiconductor light absorption layer 3.

Specifically, in the photodetector 1K, a plurality of (here, four) recesses 8 are arranged in a grid pattern. The planar shape of each recess 8 is a rectangular shape extending along the extending direction of the metal nanostructure 7. Adjacent recesses 8 and 8 are apart from each other. The second conductive type semiconductor layer 5 is located between the recesses 8 and 8. According to such a photodetector 1K, since the light receiving region (area of the scatterer) of the incident light I is expanded, it is possible to improve the detection sensitivity. In addition, as in the ninth embodiment, it is possible to detect the incident light I whose polarization directions are perpendicular to each other. The planar shape of the recess 8 is not limited to the square shape, and may be another shape such as a circular shape.

The arrangement of the scatterer 4 shown in the eleventh embodiment may be applied to the first to eighth embodiments.

Twelfth Embodiment of Photodetector

Figure 12A:
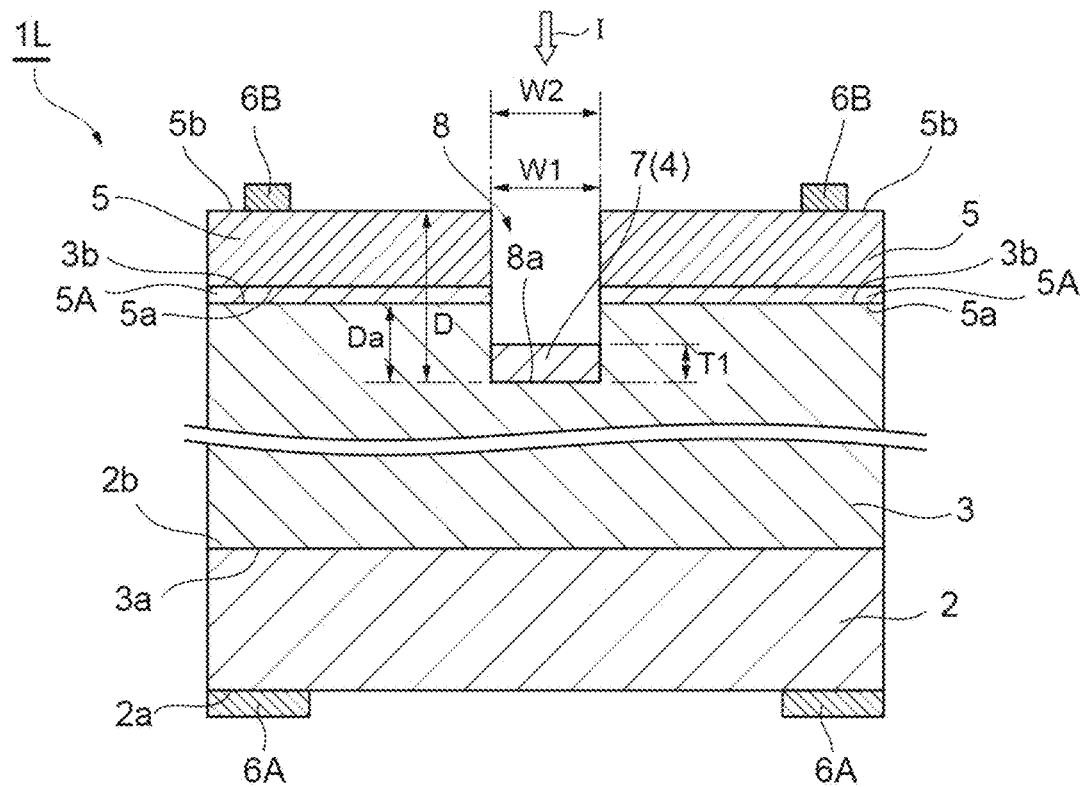
FIG. 12A is a schematic cross-sectional view showing the configuration of a photodetector according to a twelfth embodiment of the invention.
Figure 12B:
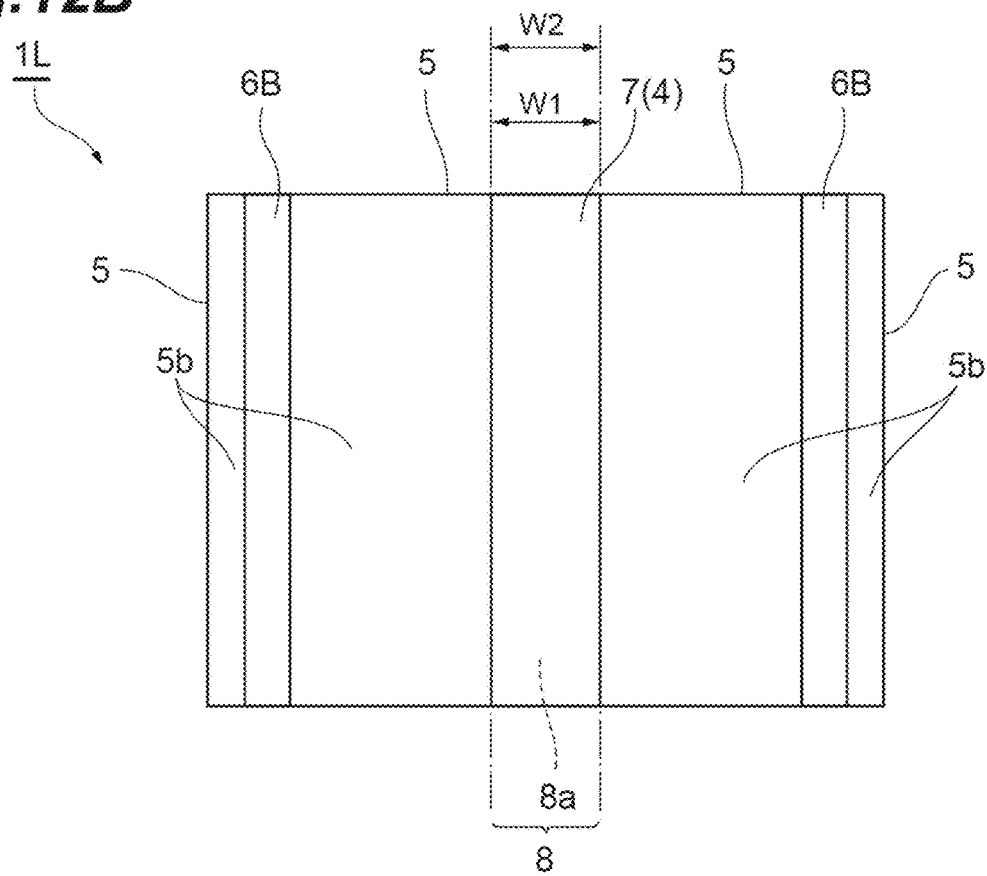
FIG. 12B is a plan view of FIG. 12A.

FIG. 12A is a schematic cross-sectional view showing the configuration of a photodetector according to a twelfth embodiment of the invention, and FIG. 12B is a plan view of FIG. 12A. As shown in FIGS. 12A and 12B, a photodetector 1L according to the twelfth embodiment is different from the photodetector 1C according to the third embodiment in that the conductive type of the semiconductor light absorption layer 3 is inverted.

Specifically, in the photodetector 1L, the semiconductor light absorption layer 3 is formed of, for example, Si whose conductive type is n-type. The semiconductor light absorption layer 3 is formed of a high resistance semiconductor (n) having a low carrier concentration. The second conductive type semiconductor layer 5 is formed of, for example, p-type Si, as in the third embodiment. The second conductive type semiconductor layer 5 is formed of a low resistance semiconductor (p$^+$) having a high carrier concentration. In other embodiments, a pn junction is formed at the interface between the first conductive type semiconductor layer 2 and the semiconductor light absorption layer 3, but in the present embodiment, a pn junction is formed at the interface between the semiconductor light absorption layer 3 and the second conductive type semiconductor layer 5. According to such a photodetector 1L, a pn junction can be easily formed. A semiconductor layer 5A formed of a high resistance semiconductor (p) having a low carrier concentration may be provided on the semiconductor light absorption layer 3 side of the second conductive type semiconductor layer 5.

In the present embodiment, the thickness of the second conductive type semiconductor layer 5 including the semiconductor layer 5A is about several hundred nm, while the thickness of the semiconductor light absorption layer 3 is about 50 μm. With such a configuration, in the photodetector 1L, the depletion layer can be expanded from the interface between the semiconductor light absorption layer 3 and the second conductive type semiconductor layer 5 to the deep position of the semiconductor light absorption layer 3. Therefore, when aligning the position of the depletion layer with the region where the electric field changes abruptly due to the localized non-uniform electric field, it is not necessary to precisely adjust the depth of the recess 8. As a result, it is possible to simplify the manufacturing process.

In the photodetector 1L, the insulating layer 15 may be provided in the recess 8 as shown in the eighth embodiment. In this case, as in the eighth embodiment, it is possible to protect the scatterer 4 or prevent leakage from the scatterer 4 by using the insulating layer 15. In addition, since the refractive index of the insulating layer 15 is smaller than the refractive index of the semiconductor light absorption layer 3, the localized non-uniform electric field can be concentrated on the semiconductor light absorption layer 3 having a relatively high refractive index. Therefore, it is possible to further improve the detection sensitivity. It is possible to protect the scatterer 4 or prevent leakage from the scatterer 4 by using the insulating layer 15. In addition, in the present embodiment, since the insulating layer 15 is filled in the recess 8, the interface of the pn junction between the semiconductor light absorption layer 3 and the second conductive type semiconductor layer 5 is covered with the insulating layer 15. Therefore, it is possible to suppress the occurrence of side leakage from the interface.

Thirteenth Embodiment of Photodetector

Figure 13A:
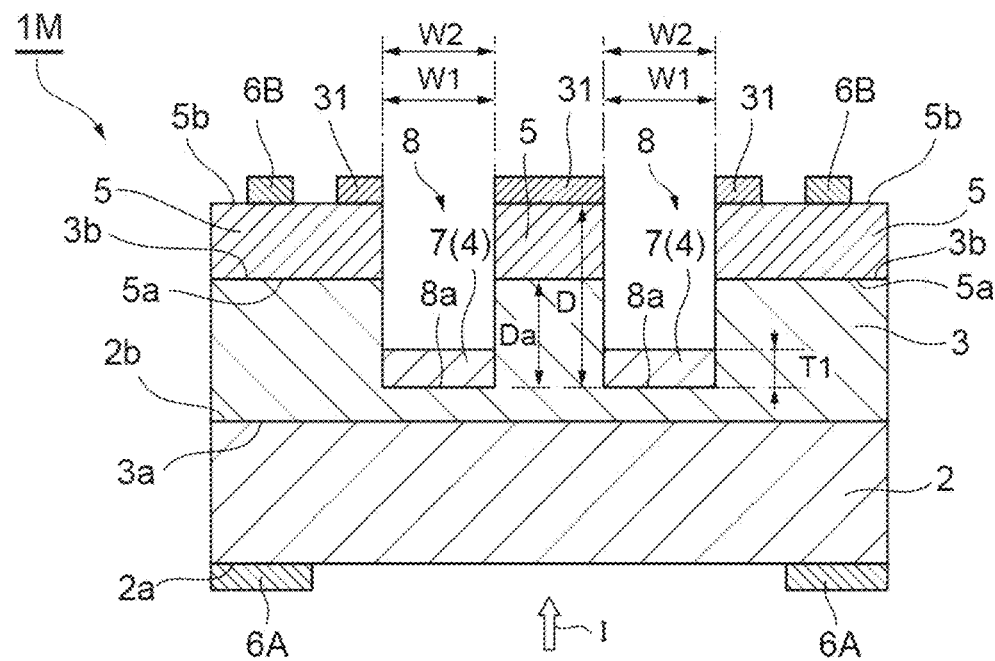
FIG. 13A is a schematic cross-sectional view showing the configuration of a photodetector according to a thirteenth embodiment of the invention.
Figure 13B:
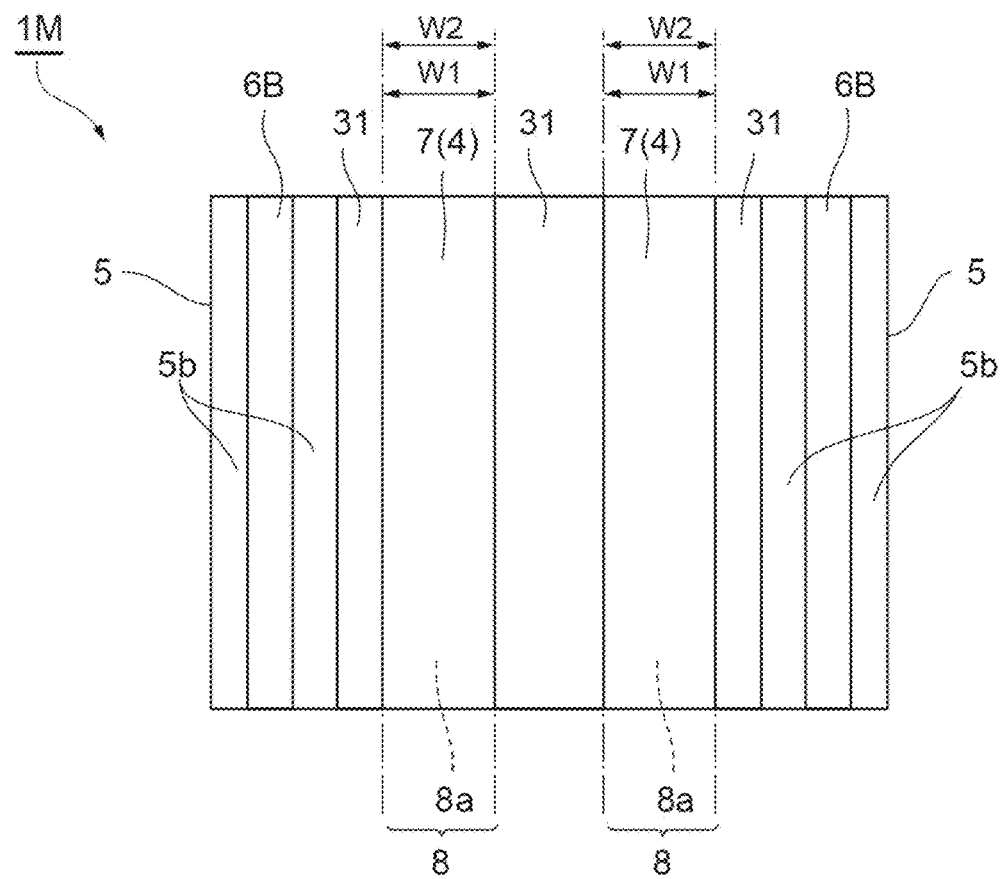
FIG. 13B is a plan view of FIG. 13A.

FIG. 13A is a schematic cross-sectional view showing the configuration of a photodetector according to a thirteenth embodiment of the invention, and FIG. 13B is a plan view of FIG. 13A. As shown in FIGS. 13A and 13B, a photodetector 1M according to the thirteenth embodiment is different from the photodetector 1C according to the third embodiment in that a plurality of (here, two) recesses 8 and a plurality of (here, two) metal nanostructures 7 arranged on the bottom surfaces 8a of the recesses 8 are provided and the photodetector 1M is a back surface incidence type photodetector in which the incident light I is incident from the back surface side.

In the photodetector 1M, the recesses 8 and the metal nanostructures 7 arranged on the bottom surfaces 8a of the recesses 8 are provided at predetermined distances in the width direction of the recess 8. A reflective film 31 is provided on the second surface 5b of the second conductive type semiconductor layer 5. In the example of FIGS. 13A and 13B, the reflective film 31 is provided at an edge portion on the extraction electrode 6B side where the recess 8 is desired and the entire region between the recesses 8 and 8, on the second surface 5b. Since the metal nanostructure 7 is located on the bottom surface 8a of the recess 8 and the reflective film 31 is located on the second surface 5b of the second conductive type semiconductor layer 5, the metal nanostructure 7 and the reflective film 31 are not electrically connected to each other. According to such a photodetector 1M, of the incident light I incident on the back surface, a component transmitted through the scatterer 4 is reflected by the reflective film 31 and directed toward the semiconductor light absorption layer 3 again. Therefore, it is possible to improve the amount of light absorption in the semiconductor light absorption layer 3.

Process of Manufacturing Photodetector

Subsequently, a process of manufacturing a photodetector will be described. Here, as a representative example, an example of a process of manufacturing the photodetector 1A according to the first embodiment, the photodetector 1C according to the third embodiment, and the photodetector 1D according to the fourth embodiment will be described.

Figure 14A:
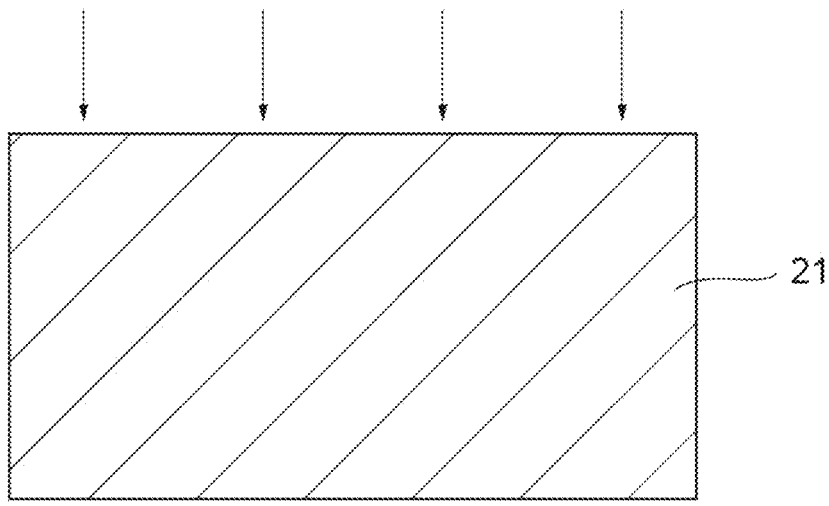
FIG. 14A is a schematic cross-sectional view showing an example of a process of manufacturing the photodetector according to the first embodiment.
Figure 14B:
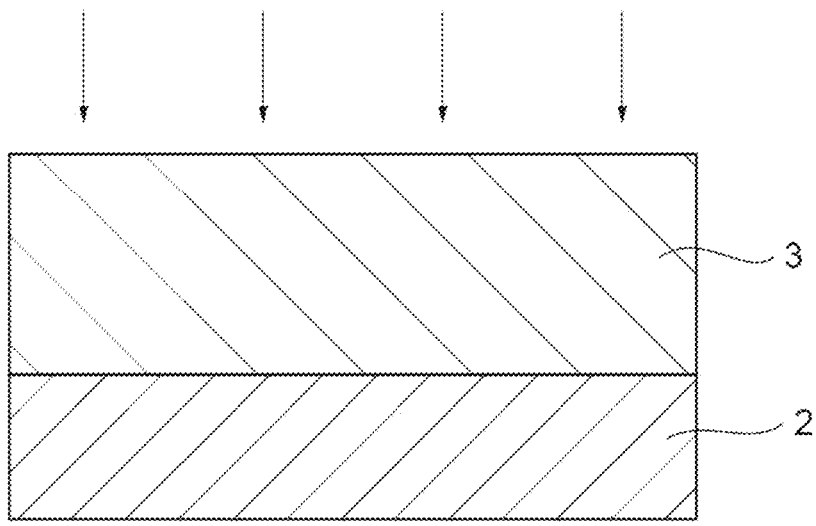
FIG. 14B is a schematic cross-sectional view showing a step subsequent to FIG. 14A.

In manufacturing the photodetector 1A, first, as shown in FIG. 14A, a semiconductor substrate 21 whose conductive type is n-type is prepared. The semiconductor substrate 21 is ion-implanted and heat-treated to invert some impurities in a part of the semiconductor substrate 21. As a result, as shown in FIG. 14B, the first conductive type semiconductor layer 2 whose conductive type is n-type and the semiconductor light absorption layer 3 whose conductive type is p-type are formed to form a pn junction. As a dopant, for example, boron (B), gallium (Ga), and aluminum (Al) can be used.

Figure 14C:
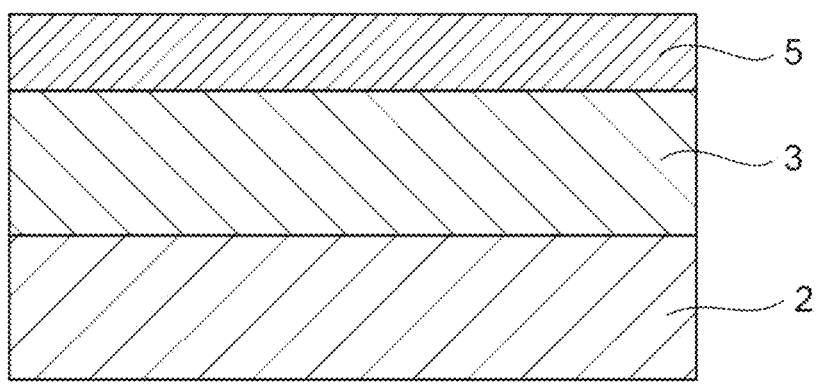
FIG. 14C is a schematic cross-sectional view showing a step subsequent to FIG. 14B.
Figure 15A:
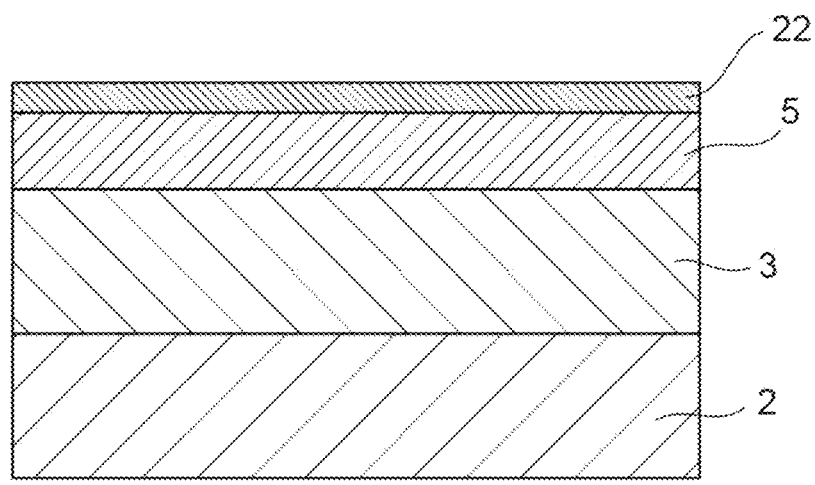
FIG. 15A is a schematic cross-sectional view showing a step subsequent to FIG. 14C.
Figure 15B:
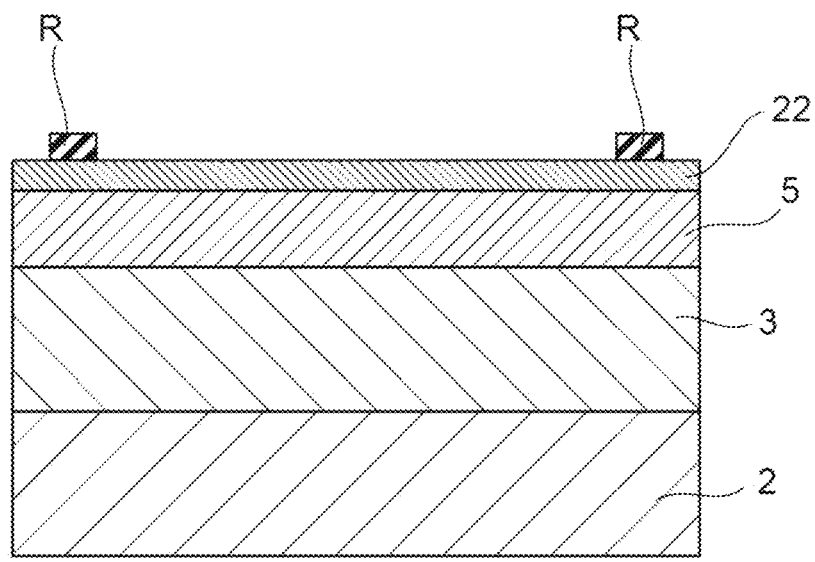
FIG. 15B is a schematic cross-sectional view showing a step subsequent to FIG. 15A.
Figure 15C:
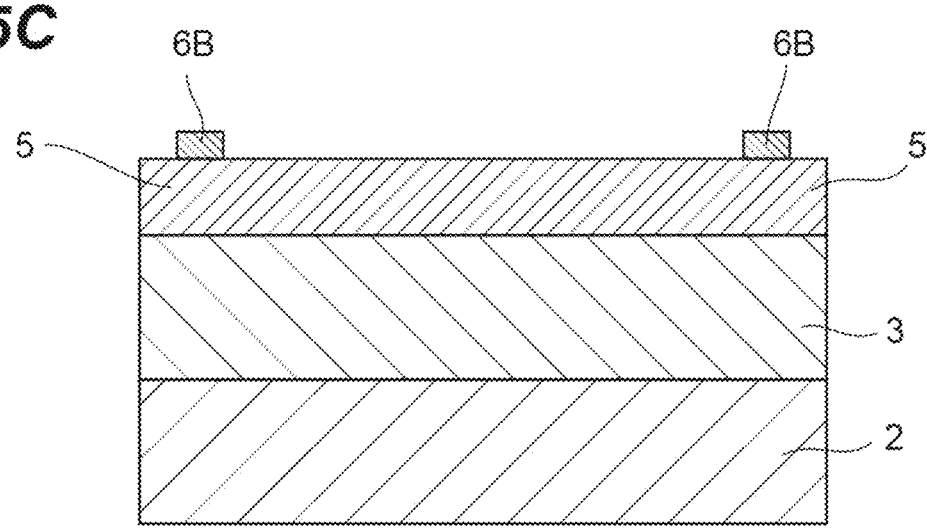
FIG. 15C is a schematic cross-sectional view showing a step subsequent to FIG. 15B.

Then, the semiconductor light absorption layer 3 is ion-implanted with an increased dose and heat-treated to convert a part of the semiconductor light absorption layer 3 into the second conductive type semiconductor layer 5 whose conductive type is p-type as shown in FIG. 14C. After forming the second conductive type semiconductor layer 5, as shown in FIG. 15A, a metal layer 22 to be the extraction electrode 6B is formed on the second conductive type semiconductor layer 5. Then, as shown in FIG. 15B, a resist R is patterned on the metal layer 22 by using photolithography. After patterning the resist R, as shown in FIG. 15C, the metal layer 22 exposed from the resist R is etched to form the extraction electrode 6B.

Figure 16A:
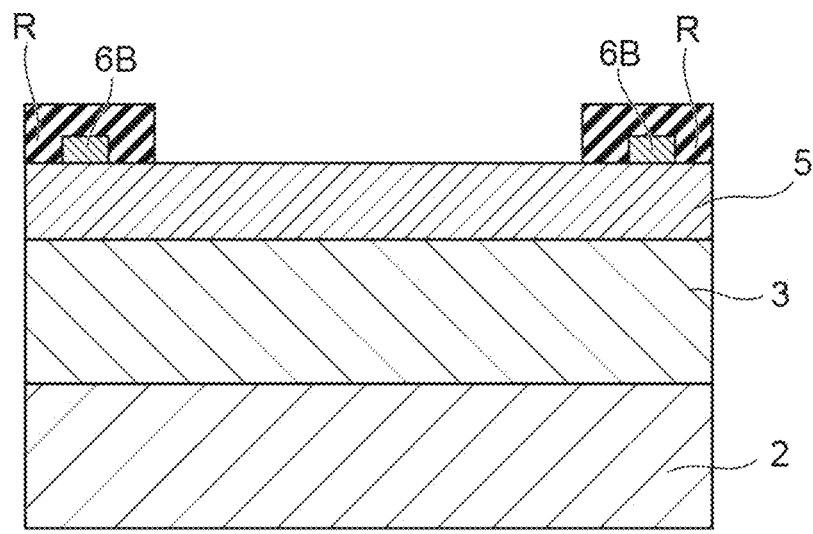
FIG. 16A is a schematic cross-sectional view showing a step subsequent to FIG. 15C.
Figure 16B:
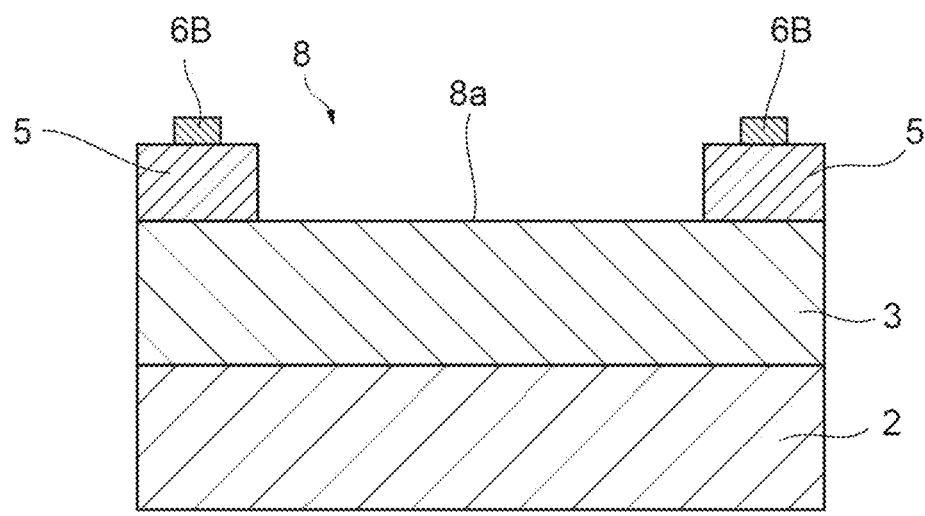
FIG. 16B is a schematic cross-sectional view showing a step subsequent to FIG. 16A.

After forming the extraction electrode 6B, as shown in FIG. 16A, the resist R is patterned on the second conductive type semiconductor layer 5 so as to cover the extraction electrode 6B by using photolithography. After patterning the resist R, as shown in FIG. 16B, the second conductive type semiconductor layer 5 is etched to a depth at which the semiconductor light absorption layer 3 is exposed to form the recess 8. Examples of the material of the resist R include a positive resist generally used in photolithography. As the etching method, for example, dry etching using sulfur hexafluoride ($SF_6$) and cyclobutane octafluoride ($C_4F_8$) can be used.

Figure 17A:
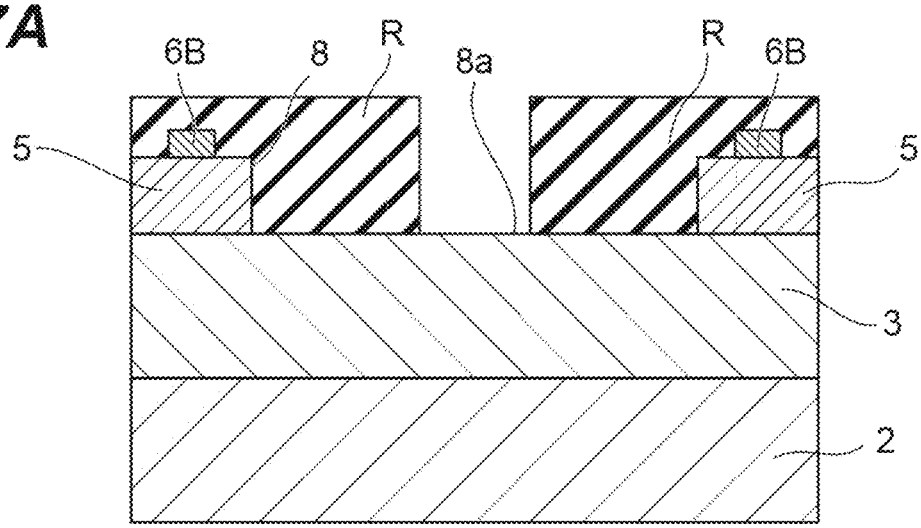
FIG. 17A is a schematic cross-sectional view showing a step subsequent to FIG. 16B.
Figure 17B:
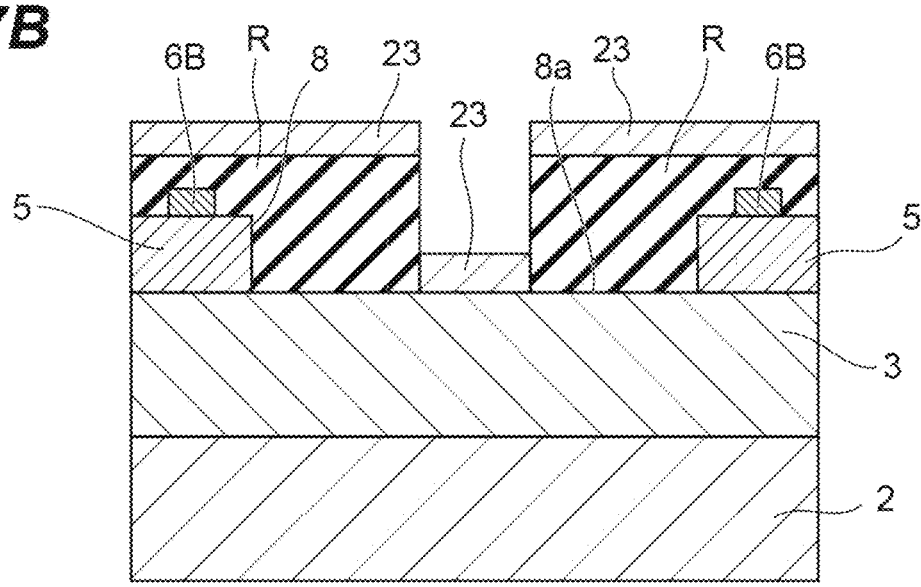
FIG. 17B is a schematic cross-sectional view showing a step subsequent to FIG. 17A.

After forming the recess 8, as shown in FIG. 17A, the resist R is nano-patterned on the second conductive type semiconductor layer 5, the extraction electrode 6B, and the semiconductor light absorption layer 3 exposed from the recess 8 by using an electron beam lithography apparatus. After nano-patterning the resist R, as shown in FIG. 17B, a layer (here, a metal layer 23) to be the scatterer 4 is formed on the resist R and on the semiconductor light absorption layer 3 (bottom surface 8a of the recess 8) exposed from the resist R. As the material of the resist R, a material generally used in electron beam lithography can be used. Examples of such a material include a non-chemically amplified positive electron beam resist and a polymethyl methacrylate resin.

Figure 17C:
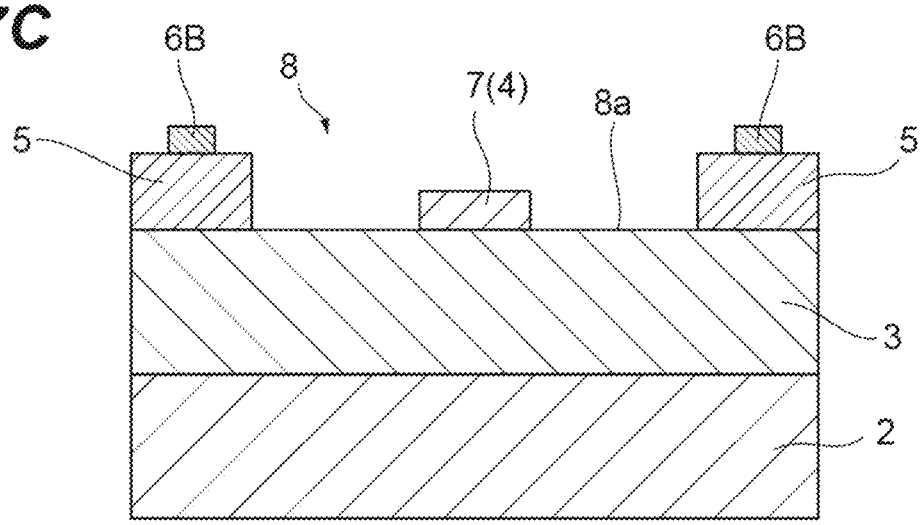
FIG. 17C is a schematic cross-sectional view showing a step subsequent to FIG. 17B.

After forming the metal layer 23, the resist R and the metal layer 23 on the resist R are lifted off. As a result, as shown in FIG. 17C, the scatterer 4 (metal nanostructure 7) that is in contact with the semiconductor light absorption layer 3 and is apart from the second conductive type semiconductor layer 5 and the extraction electrode 6B is formed on the bottom surface 8a of the recess 8. Finally, the extraction electrode 6A (see FIG. 1A) is formed on the first conductive type semiconductor layer 2 side to obtain the photodetector 1A shown in FIG. 1A.

Figure 18A:
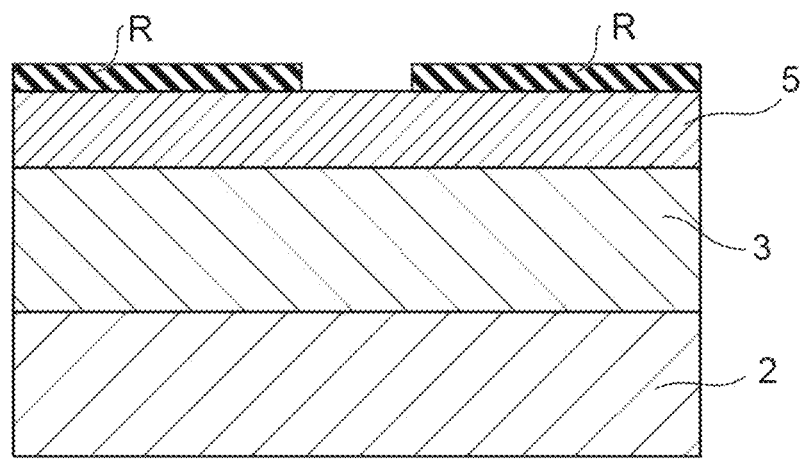
FIG. 18A is a schematic cross-sectional view showing an example of a step of manufacturing the photodetector according to the third embodiment.
Figure 18B:
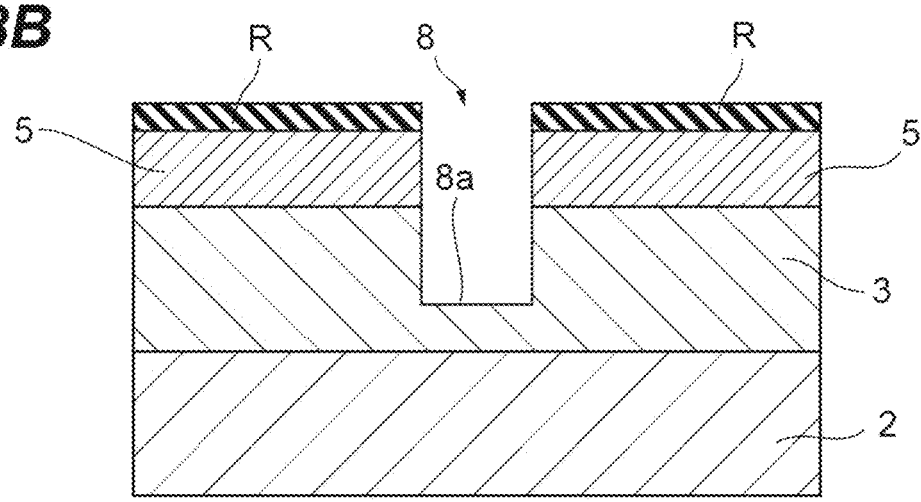
FIG. 18B is a schematic cross-sectional view showing the subsequent steps of FIG. 18A.

In manufacturing the photodetector 1C, first, the steps shown in FIGS. 14A to 14C described above are performed to form the first conductive type semiconductor layer 2, the semiconductor light absorption layer 3, and the second conductive type semiconductor layer 5. Then, as shown in FIG. 18A, the resist R is nano-patterned on the second conductive type semiconductor layer 5 by using an electron beam lithography apparatus. After nano-patterning the resist R, as shown in FIG. 18B, the second conductive type semiconductor layer 5 exposed from the resist R is etched to a depth for cutting out a part of the semiconductor light absorption layer 3, thereby forming the recess 8.

Figure 18C:
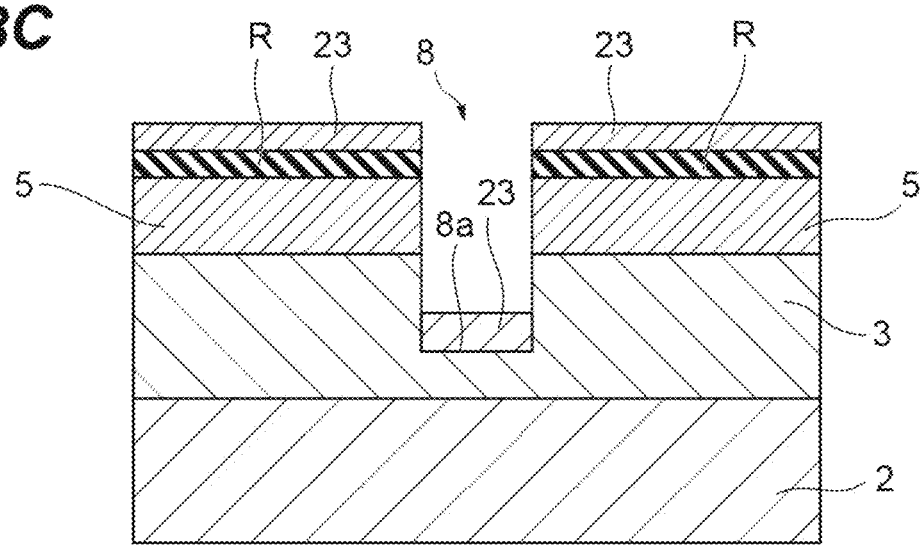
FIG. 18C is a schematic cross-sectional view showing the subsequent steps of FIG. 18B.
Figure 19A:
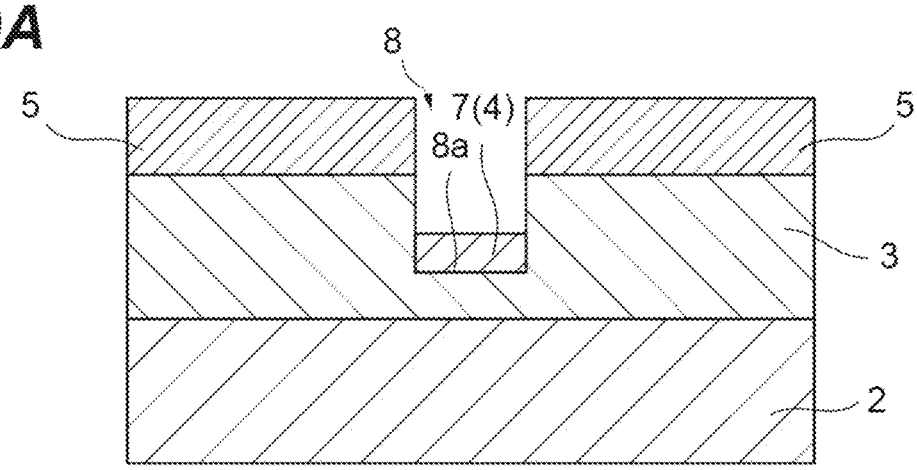
FIG. 19A is a schematic cross-sectional view showing the subsequent steps of FIG. 18C.

After forming the recess 8, as shown in FIG. 18C, the layer (here, the metal layer 23) to be the scatterer 4 is formed on the resist R and on the semiconductor light absorption layer 3 (bottom surface 8a of the recess 8) exposed from the resist R. After forming the metal layer 23, the resist R and the metal layer 23 on the resist are lifted off. As a result, as shown in FIG. 19A, the scatterer 4 (metal nanostructure 7) in contact with the semiconductor light absorption layer 3 is formed on the bottom surface 8a of the recess 8.

Figure 19B:
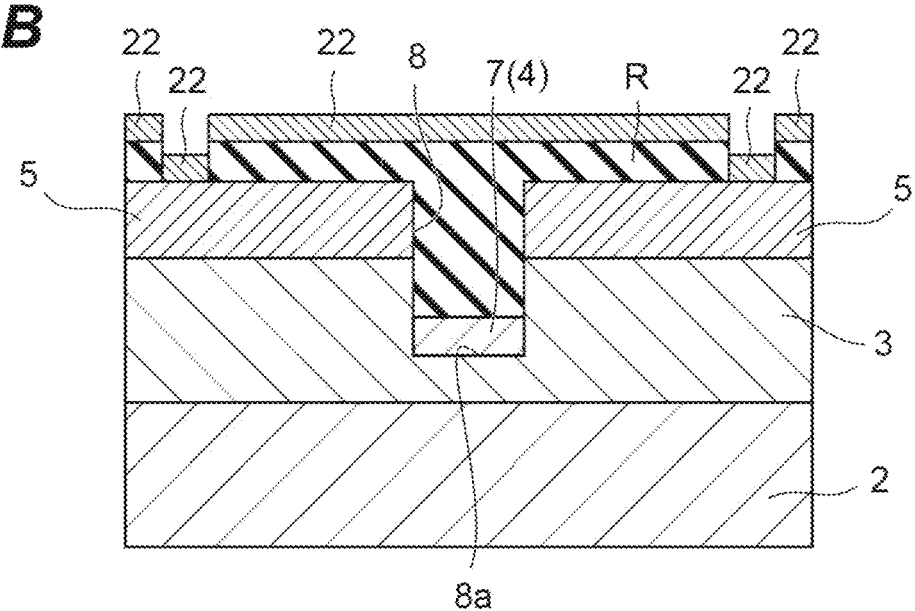
FIG. 19B is a schematic cross-sectional view showing the subsequent steps of FIG. 19A.
Figure 19C:
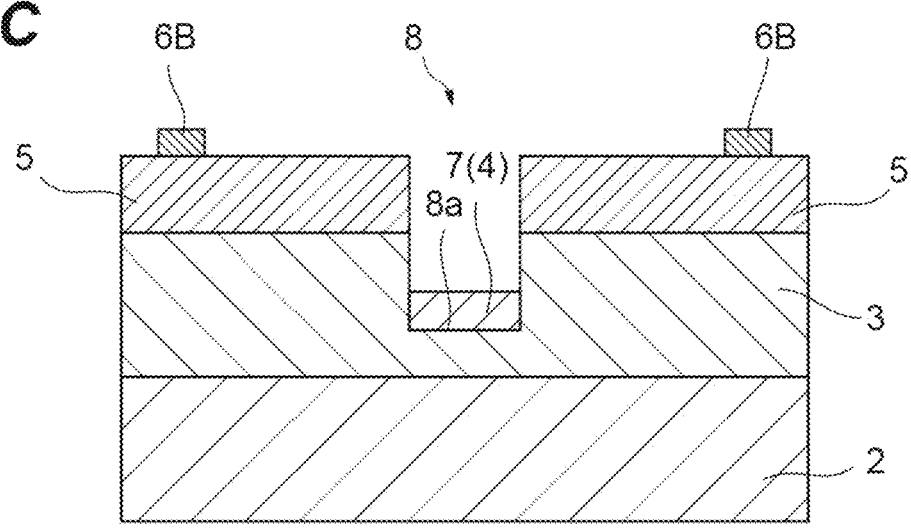
FIG. 19C is a schematic cross-sectional view showing the subsequent steps of FIG. 19B.

Then, as shown in FIG. 19B, the resist R is patterned on the second conductive type semiconductor layer 5 and in the recess 8 by using photolithography. After patterning the resist R, the metal layer 22 to be the extraction electrode 6B is formed on the second conductive type semiconductor layer 5. After forming the metal layer 22, as shown in FIG. 19C, the resist R is removed to form the extraction electrode 6B. Finally, the extraction electrode 6A (see FIG. 1A) is formed on the first conductive type semiconductor layer 2 side to obtain the photodetector 1C shown in FIGS. 3A and 3B.

Figure 20A:
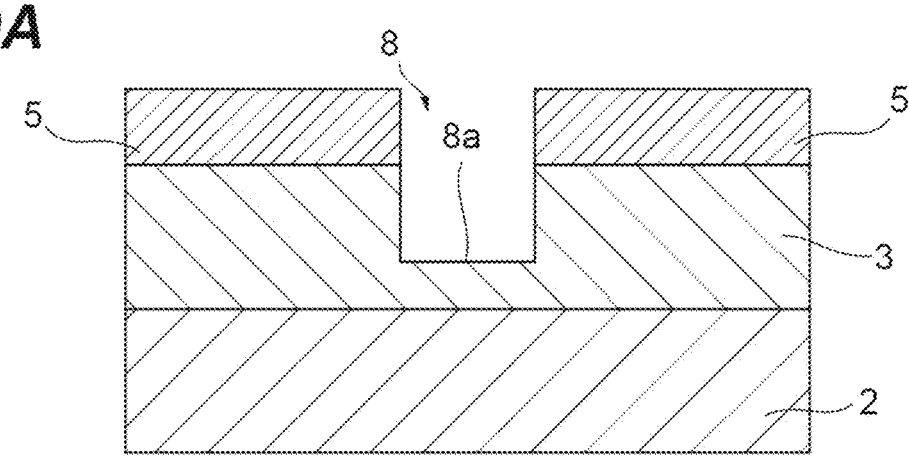
FIG. 20A is a schematic cross-sectional view showing an example of a step of manufacturing the photodetector according to the fourth embodiment.

In manufacturing the photodetector 1D, first, the steps shown in FIGS. 14A to 14C, 18A, and 18B described above are performed to form the recess 8 having a depth for cutting out a part of the semiconductor light absorption layer 3 in the second conductive type semiconductor layer 5. After forming the recess 8, as shown in FIG. 20A, the resist R on the second conductive type semiconductor layer 5 is removed.

Figure 20B:
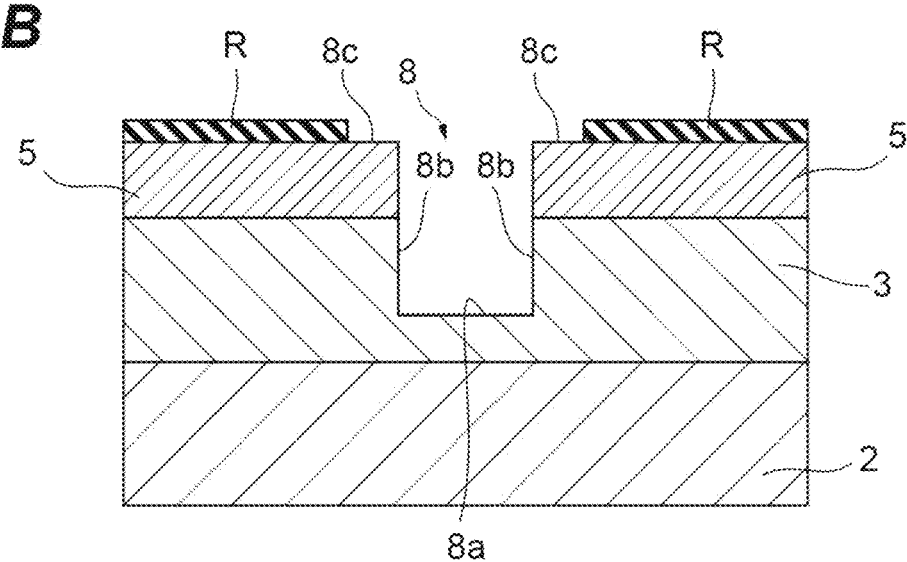
FIG. 20B is a schematic cross-sectional view showing the subsequent steps of FIG. 20A.
Figure 20C:
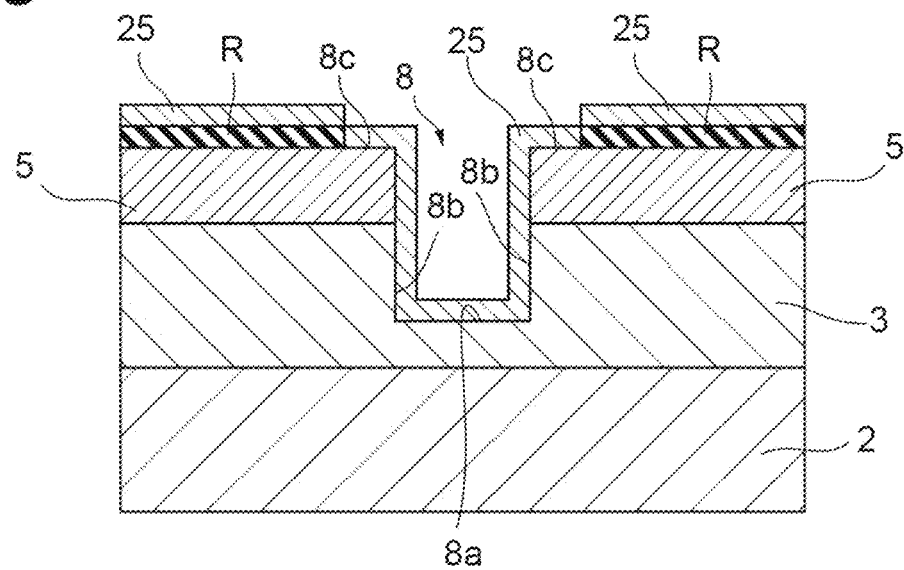
FIG. 20C is a schematic cross-sectional view showing the subsequent steps of FIG. 20B.
Figure 21A:
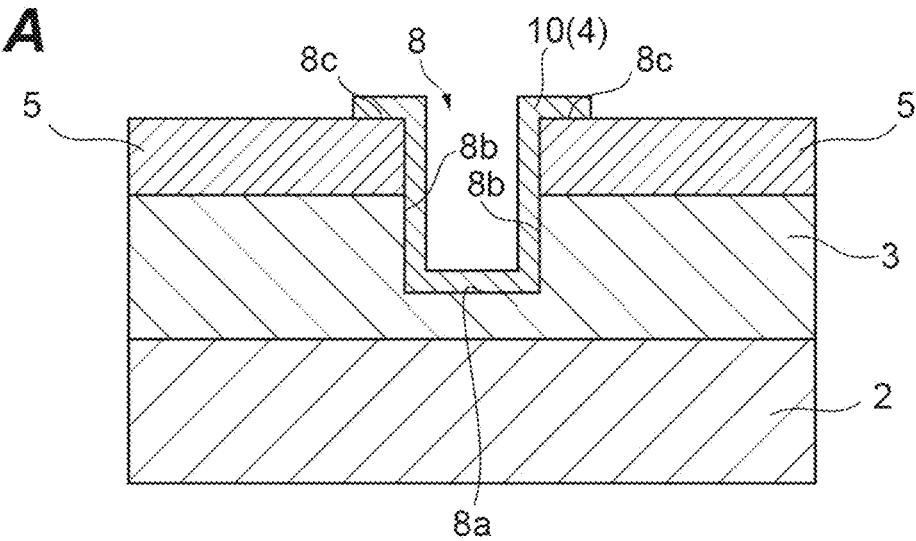
FIG. 21A is a schematic cross-sectional view showing the subsequent steps of FIG. 20C.

Then, as shown in FIG. 20B, the resist R is nano-patterned on the second conductive type semiconductor layer 5 excluding the recess 8 and the opening edge 8c of the recess 8 by using photolithography. After forming the resist R, as shown in FIG. 20C, a layer (here, a non-conductive dielectric layer 25) to be the scatterer 4 is formed on the resist R and the bottom surface 8a, the inner wall surface 8b, and the opening edge 8c of the recess 8. After forming the non-conductive dielectric layer 25, the resist R and the non-conductive dielectric layer 25 on the resist are lifted off. As a result, as shown in FIG. 21A, the scatterer 4 (non-conductive dielectric layer 25) in contact with the semiconductor light absorption layer 3 is formed on the bottom surface 8a, the inner wall surface 8b, and the opening edge 8c of the recess 8.

Figure 21B:
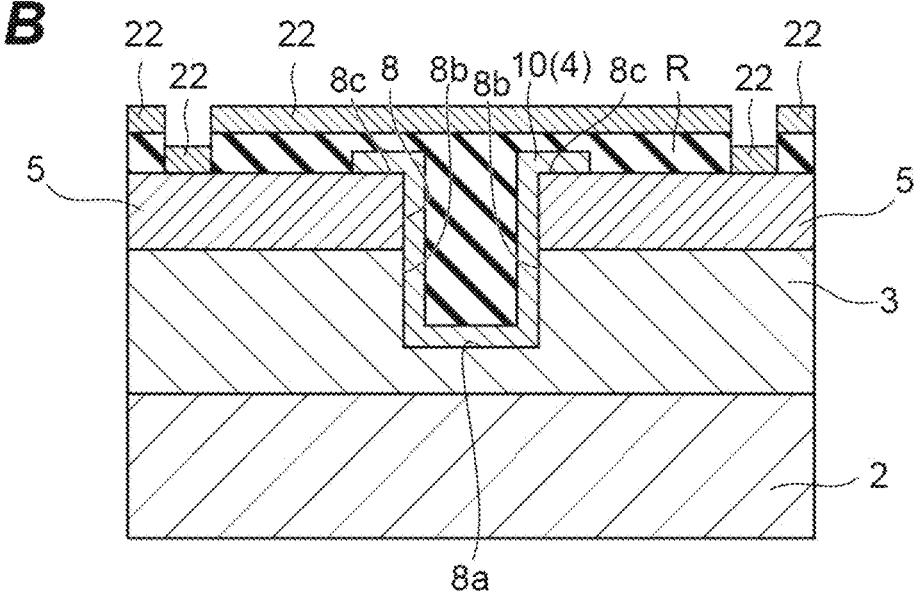
FIG. 21B is a schematic cross-sectional view showing the subsequent steps of FIG. 21A.
Figure 21C:
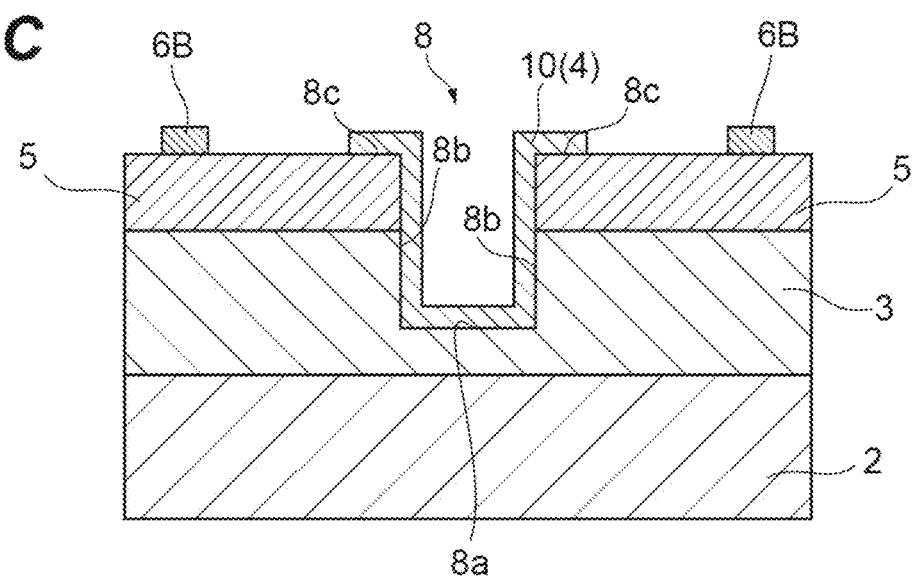
FIG. 21C is a schematic cross-sectional view showing the subsequent steps of FIG. 21B.

After forming the scatterer 4, as shown in FIG. 21B, the resist R is patterned on the second conductive type semiconductor layer 5, on the scatterer 4, and in the recess 8 by using photolithography. After patterning the resist R, the metal layer 22 to be the extraction electrode 6B is formed on the second conductive type semiconductor layer 5. After forming the metal layer 22, as shown in FIG. 21C, the resist R is removed to form the extraction electrode 6B. Finally, the extraction electrode 6A (see FIG. 1A) is formed on the first conductive type semiconductor layer 2 side to obtain the photodetector 1D shown in FIGS. 4A and 4B.

Modification Examples

The invention is not limited to the embodiments described above. For example, in the embodiments described above, each semiconductor layer is exemplified with the first conductive type as n-type and the second conductive type as p-type. However, the first conductive type may be p-type and the second conductive type may be n-type.

In the embodiments described above, except for the fourth embodiment, the metal nanostructure 7 that causes surface plasmon resonance is shown as an example of the scatterer 4. However, the scatterer 4 may also be the dielectric nanostructure 10 in other embodiments. As a material of the dielectric nanostructure, it is preferable to use a semiconductor material or an insulating material in consideration of the ease of film formation. Examples of the semiconductor material include germanium (Ge), silicon (Si), germanium silicon (GeSi), germanium tin (GeSn), and gallium arsenide (GaAs). The scatterer 4 may be formed of metal or dielectric fine particles. Examples of the metal fine particles include fine particles of gold (Au), silver (Ag), copper (Cu), and aluminum (Al). Examples of the dielectric fine particles include silica spheres, alumina spheres, and titanium oxide spheres.

What is claimed is:
1. A photodetector, comprising:
a first conductive type semiconductor layer;
a semiconductor light absorption layer provided on the first conductive type semiconductor layer;

a scatterer that is provided with a width equal to or less than a wavelength of incident light so as to be in contact with the semiconductor light absorption layer and forms a localized non-uniform electric field inside the semiconductor light absorption layer by scattering the incident light;

a second conductive type semiconductor layer provided on the semiconductor light absorption layer so as to be apart from the scatterer; and an extraction electrode that is provided on the second conductive type semiconductor layer so as to be apart from the scatterer and extracts a photocurrent generated in the semiconductor light absorption layer due to formation of the localized non-uniform electric field.

2. The photodetector according to claim 1,
wherein the scatterer is a metal nanostructure that causes surface plasmon resonance in a vicinity of an interface between the scatterer and the semiconductor light absorption layer.

3. The photodetector according to claim 1,
wherein a recess that penetrates the second conductive type semiconductor layer and cuts out a part of the semiconductor light absorption layer is provided in the second conductive type semiconductor layer, and
the scatterer is arranged on a bottom surface of the recess.

4. The photodetector according to claim 1,
wherein a recess that penetrates the second conductive type semiconductor layer and cuts out a part of the semiconductor light absorption layer is provided in the second conductive type semiconductor layer, and
the scatterer is arranged on a bottom surface and an inner wall surface of the recess.

5. The photodetector according to claim 3,
wherein the semiconductor light absorption layer is configured to include a first layer whose conductive type is p-type, a second layer whose conductive type is i-type, and a third layer whose conductive type is n-type,
the recess is provided at a depth for cutting out a part of the second layer, and
the scatterer is arranged on the bottom surface of the recess so as to be embedded in the second layer.

6. The photodetector according to claim 3,
wherein a width of the recess is equal to or less than the wavelength of the incident light over an entire depth direction.

7. The photodetector according to claim 3,
wherein a width of a portion of the recess that penetrates the second conductive type semiconductor layer is larger than a width of a portion of the recess that cuts out a part of the semiconductor light absorption layer.

8. The photodetector according to claim 3,
wherein an insulating layer formed of a material having a refractive index smaller than that of the semiconductor light absorption layer is provided in the recess.

9. The photodetector according to claim 1,
wherein a plurality of the scatterers are provided at predetermined distances in an in-plane direction of an interface between the scatterer and the semiconductor light absorption layer.

10. The photodetector according to claim 1,
wherein the photodetector is a back surface incidence type photodetector in which the incident light is incident from the first conductive type semiconductor layer side, and
a reflective film for reflecting a component transmitted through the scatterer, of the incident light incident on a back surface, to the semiconductor light absorption layer side is provided on the second conductive type semiconductor layer.

* * * * *